United States Patent
Takahashi

(10) Patent No.: US 9,871,051 B2
(45) Date of Patent: Jan. 16, 2018

(54) STACKED TYPE SEMICONDUCTOR MEMORY DEVICE AND METHOD FOR MANUFACTURING THE SAME

(71) Applicant: TOSHIBA MEMORY CORPORATION, Minato-ku (JP)

(72) Inventor: Shinya Takahashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/059,538

(22) Filed: Mar. 3, 2016

(65) Prior Publication Data

US 2017/0025436 A1 Jan. 26, 2017

Related U.S. Application Data

(60) Provisional application No. 62/195,950, filed on Jul. 23, 2015.

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ............... H01L 27/11582; H01L 27/0207
See application file for complete search history.

(56) References Cited

U.S. PATENT DOCUMENTS

| | | | |
|---|---|---|---|
| 2012/0061744 A1* | 3/2012 | Hwang | H01L 27/11565 257/324 |
| 2013/0024344 A1 | 1/2013 | Boberski et al. | |
| 2016/0276359 A1* | 9/2016 | Oginoe | H01L 27/11582 |
| 2016/0307908 A1* | 10/2016 | Sharangpani | H01L 27/1157 |
| 2016/0322381 A1* | 11/2016 | Liu | H01L 27/11573 |

\* cited by examiner

*Primary Examiner* — Bilkis Jahan
(74) *Attorney, Agent, or Firm* — Oblon, McClelland, Maier & Neustadt, L.L.P.

(57) ABSTRACT

A semiconductor memory device according to an embodiment, includes a stacked body, first and second semiconductor pillars and a contact. The stacked body includes insulating films and electrode films stacked alternately along a first direction. A configuration of an end portion of the stacked body in a second direction is a stairstep configuration. A step is formed in the stairstep configuration for each of the electrode films. The first semiconductor pillars are disposed in a region of the stacked body where the steps are not formed. The second semiconductor pillars are disposed in a region of the stacked body where the steps are formed. The contact is disposed on the electrode film for each of the steps. When viewed from the first direction, the first and second semiconductor pillars are disposed at some of lattice points of a lattice.

9 Claims, 20 Drawing Sheets

US 9,871,051 B2

STACKED TYPE SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/195,950, filed on Jul. 23, 2015; the entire contents of which are incorporated herein by reference.

FIELD

Embodiments relate to a semiconductor memory device and a method for manufacturing the same.

BACKGROUND

In recent years, a stacked type semiconductor memory device in which memory cells are integrated three-dimensionally has been proposed. In such a stacked type semiconductor memory device, a stacked body in which electrode films and inter-layer insulating films are stacked alternately is provided; silicon pillars pierce the stacked body; and memory cells are formed at each intersection between the electrode films and the silicon pillars. Then, the end portion of the stacked body is patterned into a stairstep configuration; and each electrode film is drawn out outside the stacked body by connecting a contact to the electrode film of each step of the stairsteps.

DETAILED DESCRIPTION

A semiconductor memory device according to an embodiment, includes a stacked body, a plurality of first semiconductor pillars, a first memory film, a plurality of second semiconductor pillars and a contact. The stacked body includes a plurality of insulating films and a plurality of electrode films. Each of the plurality of insulating films and each of the plurality of electrode films are stacked alternately along a first direction. A configuration of an end portion of the stacked body in a second direction is a stairstep configuration. The second direction is orthogonal to the first direction. A step is formed in the stairstep configuration for each of the electrode films. The plurality of first semiconductor pillars are disposed in a region of the stacked body where the steps are not formed. The plurality of first semiconductor pillars extend in the first direction and piercing the stacked body. The first memory film is formed between one of the first semiconductor pillars and one of the electrode films. The plurality of second semiconductor pillars are disposed in a region of the stacked body where the steps are formed. The plurality of second semiconductor pillars extend in the first direction and piercing the stacked body. The contact is disposed on the electrode film and is connected to the electrode film for each of the steps. When viewed from the first direction, the plurality of first semiconductor pillars and the plurality of second semiconductor pillars are disposed at some of lattice points of a lattice. The lattice is made of first imaginary straight lines extending in a third direction and second imaginary straight lines extending in a fourth direction intersecting the third direction. The contact is disposed at a position including other of the lattice points. The second semiconductor pillars are not disposed at the lattice points included in the contact.

Embodiments of the invention will now be described with reference to the drawings.

First Embodiment

First, a first embodiment will be described.

Figure 1:
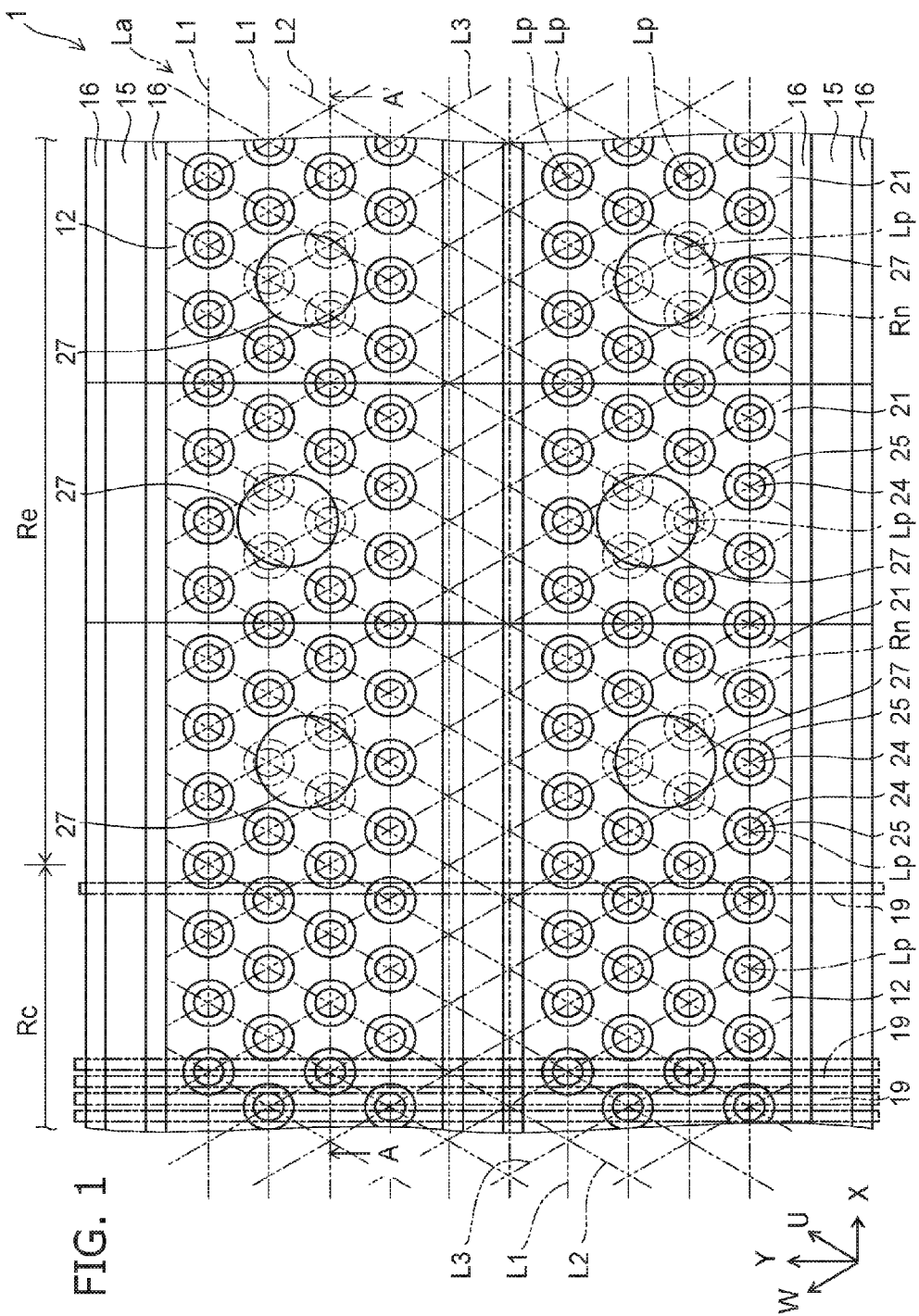
FIG. 1 is a plan view showing a semiconductor memory device according to a first embodiment.

FIG. 1 is a plan view showing a semiconductor memory device according to the embodiment.

Figure 2:
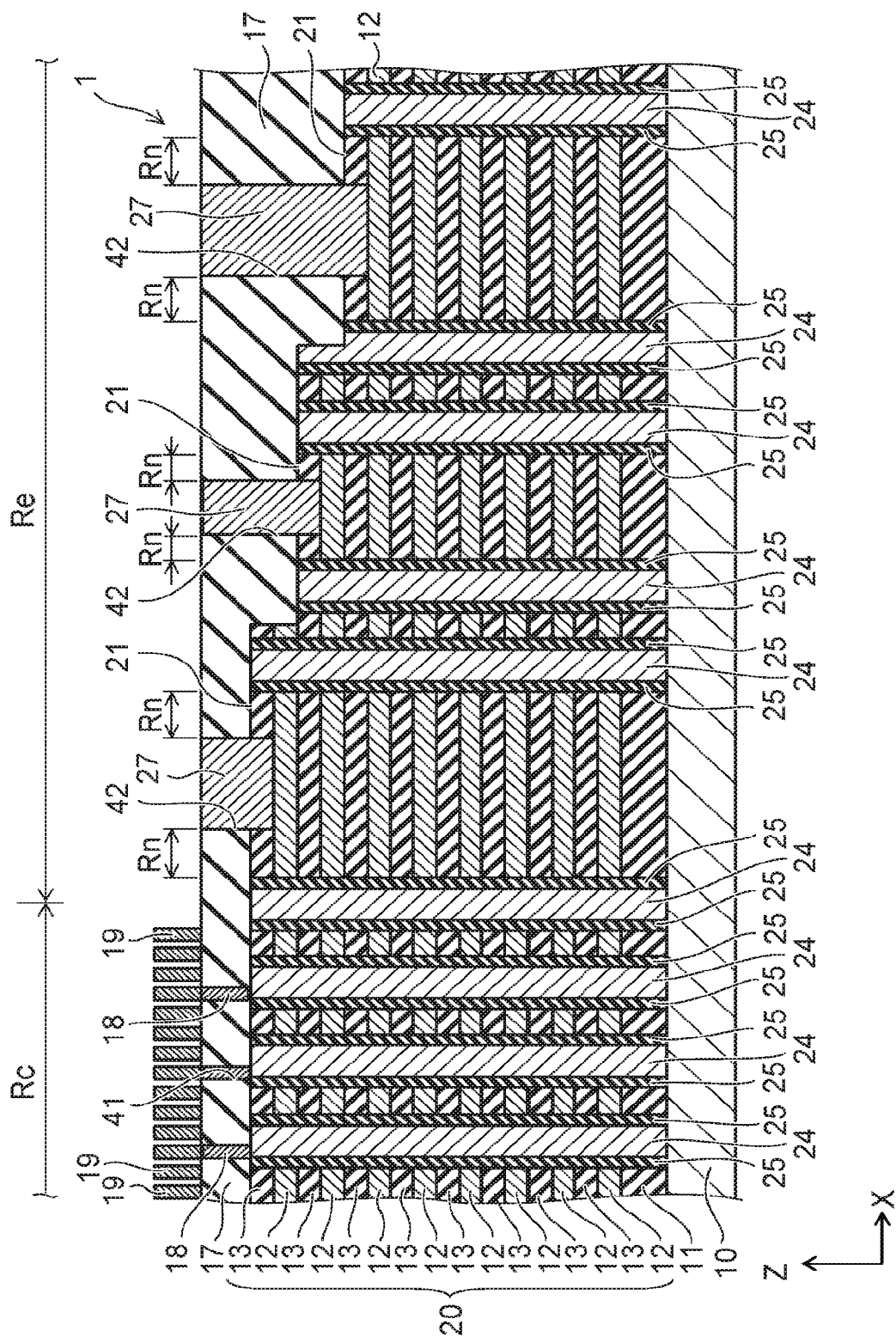
FIG. 2 is a cross-sectional view showing the semiconductor memory device according to the first embodiment and shows a cross section along line A-A' of FIG. 1.

FIG. 2 is a cross-sectional view showing the semiconductor memory device according to the embodiment and shows a cross section along line A-A' of FIG. 1.

As shown in FIG. 1 and FIG. 2, a silicon substrate 10 is provided in the semiconductor memory device 1 according to the embodiment. Hereinbelow, an XYZ orthogonal coordinate system is employed in the specification for convenience of description. Mutually orthogonal directions parallel to the upper surface of the silicon substrate 10 are taken as an "X-direction" and a "Y-direction;" and a direction perpendicular to the upper surface of the silicon substrate 10 is taken as a "Z-direction."

A silicon oxide film 11 is provided on the silicon substrate 10. A stacked body 20 is provided on the silicon oxide film 11. Electrode films 12 and inter-layer insulating films 13 are stacked alternately along the Z-direction in the stacked body 20. In the electrode film 12, for example, a main body unit (not shown) is made of tungsten (W) and covered with a barrier metal layer (not shown) made of titanium nitride (TiN). For example, the inter-layer insulating films 13 are formed of silicon oxide ($SiO_2$).

An end portion in the X-direction of the stacked body 20 is patterned into a stairstep configuration; and a step 21 is formed for each of the electrode films 12. The steps 21 are arranged in one column along the X-direction. Hereinbelow, when viewed from the Z-direction, the region of the stacked body 20 where the steps 21 are not formed is called a cell region Rc; and the region where the steps 21 are formed is called a draw-out region Re. The cell region Rc corresponds to the X-direction central portion of the stacked body 20; and the draw-out region Re corresponds to the two X-direction end portions of the stacked body 20. The stairsteps of the draw-out region Re are lower away from the cell region Rc.

A source electrode 15 that extends in the X-direction is provided inside the stacked body 20. The configuration of the source electrode 15 is a plate configuration spreading along the XZ plane; and the source electrode 15 divides the stacked body 20 and the silicon oxide film 11 in the Y-direction. The lower end of the source electrode 15 is connected to the silicon substrate 10. For example, the source electrode 15 is formed of tungsten. Insulating members 16 are provided on the two Y-direction side surfaces of the source electrode 15. The configurations of the insulating members 16 are plate configurations spreading along the XZ plane; and the insulating members 16 are formed of, for example, silicon oxide. The electrode film 12 is subdivided into multiple band-like portions extending in the X-direction by the source electrode 15 and the insulating members 16.

Silicon pillars 24 that extend in the Z-direction are provided inside the stacked body 20. The silicon pillars 24 are provided in both the cell region Rc and the draw-out region Re. The silicon pillars 24 pierce the inter-layer insulating films 13, the electrode films 12, and the silicon oxide film 11; and the lower ends of the silicon pillars 24 are connected to the silicon substrate 10. The configurations of the silicon pillars 24 are circular columns or circular tubes. An example is shown in FIG. 1 and FIG. 2 in which the silicon pillars 24 are circular columns. In the case where the silicon pillars 24 are circular tubes, for example, circular column silicon oxide members are filled into the silicon pillars 24.

A memory film 25 is provided on the side surface of the silicon pillar 24. A tunneling insulating film, a charge storage film, and a blocking insulating film are stacked in the memory film 25 in order from the silicon pillar 24 side. Although the tunneling insulating film normally is insulative, the tunneling insulating film is a film in which a tunneling current flows when a prescribed voltage within the range of the drive voltage of the semiconductor memory device 1 is applied and is formed of, for example, a single-layer silicon oxide film or an ONO film in which a silicon oxide layer, a silicon nitride layer, and a silicon oxide layer are stacked in this order. The charge storage film is an insulating film that can store charge, is made of, for example, a material having trap sites of the charge, and is formed of, for example, silicon nitride. The blocking insulating film is a film in which a current substantially does not flow even when a voltage within the range of the drive voltage of the semiconductor memory device 1 is applied, includes, for example, a material having a higher dielectric constant than silicon oxide, and is, for example, a stacked film in which a silicon oxide layer, a hafnium oxide layer, and a silicon oxide layer are stacked in this order.

Other than the lengths in the Z-direction, the configurations of the silicon pillars 24 and the memory films 25 provided in the cell region Rc are substantially the same as the configurations of the silicon pillars 24 and the memory films 25 provided in the draw-out region Re. For example, the composition of the silicon pillars 24 provided in the cell region Rc is the same as the composition of the silicon pillars 24 provided in the draw-out region Re.

For example, an inter-layer insulating film 17 that is made of silicon oxide is provided on the stacked body 20. Plugs 18 that pierce the inter-layer insulating film 17 in the Z-direction are provided inside the inter-layer insulating film 17 in the cell region Rc. Also, bit lines 19 that extend in the Y-direction are provided on the inter-layer insulating film 17. Each of the bit lines 19 is connected via the plug 18 to the silicon pillar 24 connected to the cell region Rc. Thereby, in the cell region Rc, the silicon pillar 24 is connected between the bit line 19 and the silicon substrate 10. Also, a memory cell transistor is formed, with the memory film 25 interposed, at each intersection between the silicon pillars 24 and the electrode films 12. In such a case, the silicon pillar 24 is used as a body of the memory cell transistor; and the electrode film 12 is used as a gate of the memory cell transistor. A NAND string in which multiple memory cell transistors are connected in series is formed between the bit line 19 and the silicon substrate 10. In such a case, the electrode film 12 of the lowermost level and the electrode film 12 of the uppermost level may be included respectively in a lower selection transistor and an upper selection transistor.

On the other hand, in the draw-out region Re, the plugs 18 and the bit lines 19 are not provided; and the silicon pillars 24 are not connected to the bit lines 19. Accordingly, the silicon pillars 24 provided in the draw-out region Re are not included in NAND strings and do not function as memory cell transistors.

In the draw-out region Re, a contact 27 is provided inside the inter-layer insulating film 17 in each region directly above the step 21. The contact 27 is provided on the electrode film 12 included in each step 21 and is connected to the electrode film 12.

In FIG. 1, the inter-layer insulating films 13 and 17 and the plugs 18 are not shown for easier viewing of the drawing. Also, for the bit lines 19 as well, only some of the bit lines 19 are illustrated by double dot-dash lines; and the remaining bit lines 19 are not shown.

Also, when viewed from the Z-direction, the silicon pillars 24 disposed in the cell region Rc and the silicon pillars 24 disposed in the draw-out region Re are disposed at a portion of lattice points Lp of a lattice La made of imaginary straight lines L1, L2, and L3. The straight lines L1 extend in the X-direction. The straight lines L2 extend in a U-direction that is orthogonal to the Z-direction and intersects both the X-direction and the Y-direction. The straight lines L3 extend in a W-direction that is orthogonal to the Z-direction and intersects the X-direction, the Y-direction, and the U-direction. In the embodiment, the arrangement period of the straight lines L1, the arrangement period of the straight lines L2, and the arrangement period of the straight lines L3 are equal to each other; the straight lines L2 are tilted 60° counterclockwise in the illustration with respect to the straight lines L1; and the straight lines L3 are tilted 60° counterclockwise with respect to the straight lines L2. Therefore, the unit lattice of the lattice La is an equilateral triangle.

Also, when viewed from the Z-direction, the contacts 27 are disposed at positions including one other portion of the lattice points Lp of the lattice La. The diameter of the contact 27 is not less than the period of the lattice La, i.e., the distance between the mutually-adjacent lattice points Lp; and at least three lattice points are disposed inside the contact 27 and inside a proximal region Rn between the contact 27 and the silicon pillar 24 most proximal to the contact 27. When viewed from the Z-direction, the silicon pillars 24 and the memory films 25 are not disposed at the lattice points Lp disposed inside the contact 27 and inside the proximal region Rn. Thus, the silicon pillars 24 are not provided in the region directly under the contact 27; and the contact 27 is not connected to the silicon pillars 24.

In the embodiment, three lattice points Lp that are positioned at the vertices of the equilateral triangle which is the unit lattice of the lattice La are disposed inside the contact 27 and inside the proximal region Rn. In FIG. 1, the silicon pillars 24 and the memory films 25 that correspond to the lattice points Lp inside the contact 27 and inside the proximal region Rn and actually are not disposed are illustrated by double dot-dash lines. Also, when viewed from the Z-direction, the silicon pillars 24 are not disposed at the lattice points Lp disposed inside the source electrode 15 and inside the insulating members 16.

Also, in each of the steps 21, when viewed from the Z-direction, the silicon pillars 24 are disposed at the periphery of the contact 27. In particular, in each of the steps 21, at least one silicon pillar 24 is disposed between the contact 27 and the insulating member 16. Also, at least one silicon pillar 24 is disposed on the side of the contact 27 distal to the cell region Rc.

A method for manufacturing the semiconductor memory device according to the embodiment will now be described.

FIG. 3, FIG. 5, FIG. 7, and FIG. 11 are plan views showing the method for manufacturing the semiconductor memory device according to the embodiment.

FIG. 4, FIG. 6, FIG. 8 to FIG. 10, FIG. 12, and FIG. 13 are cross-sectional views showing the method for manufacturing the semiconductor memory device according to the embodiment.

Figure 3:
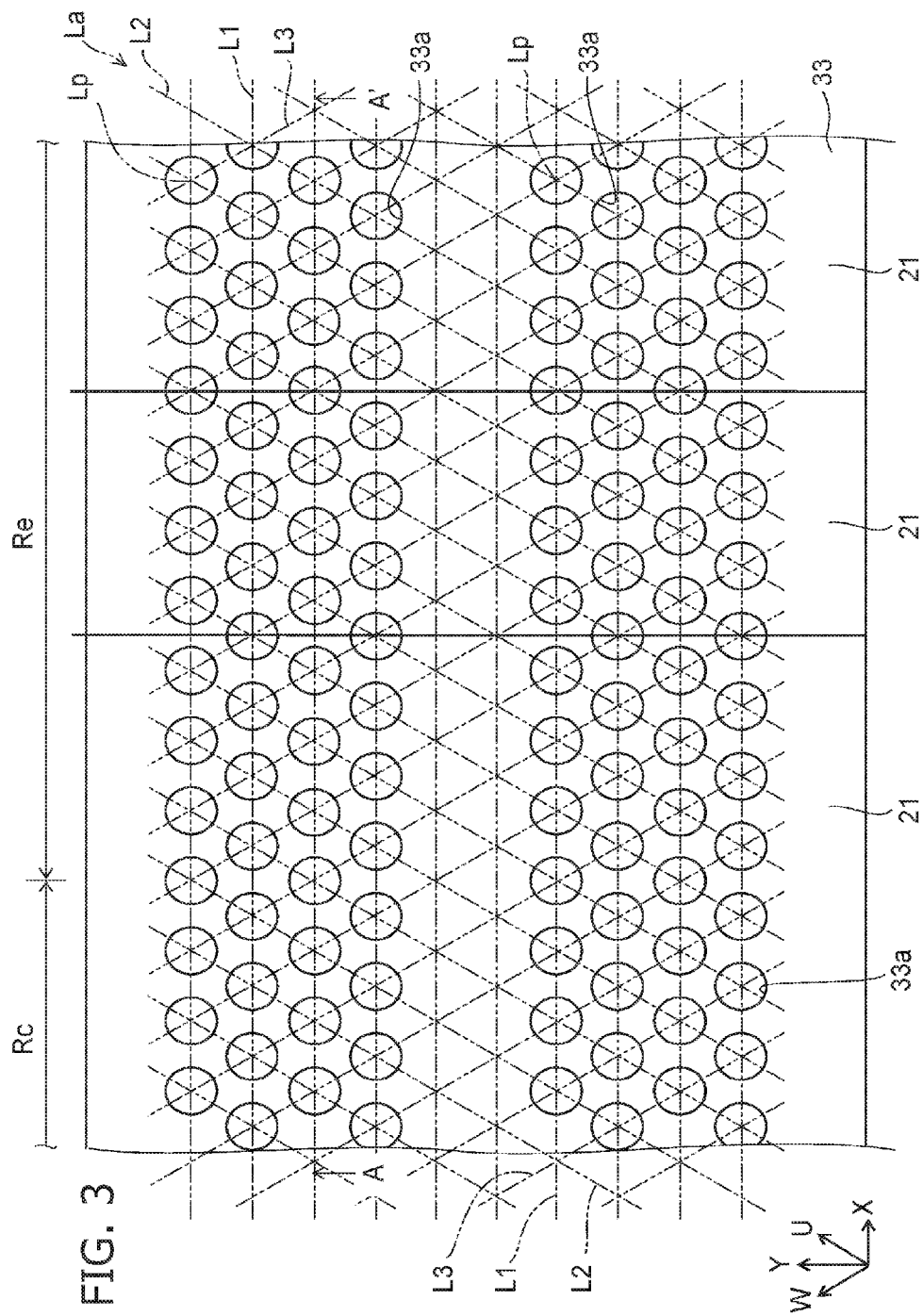
FIG. 3 is plan view showing a method for manufacturing the semiconductor memory device according to the first embodiment.
Figure 4:
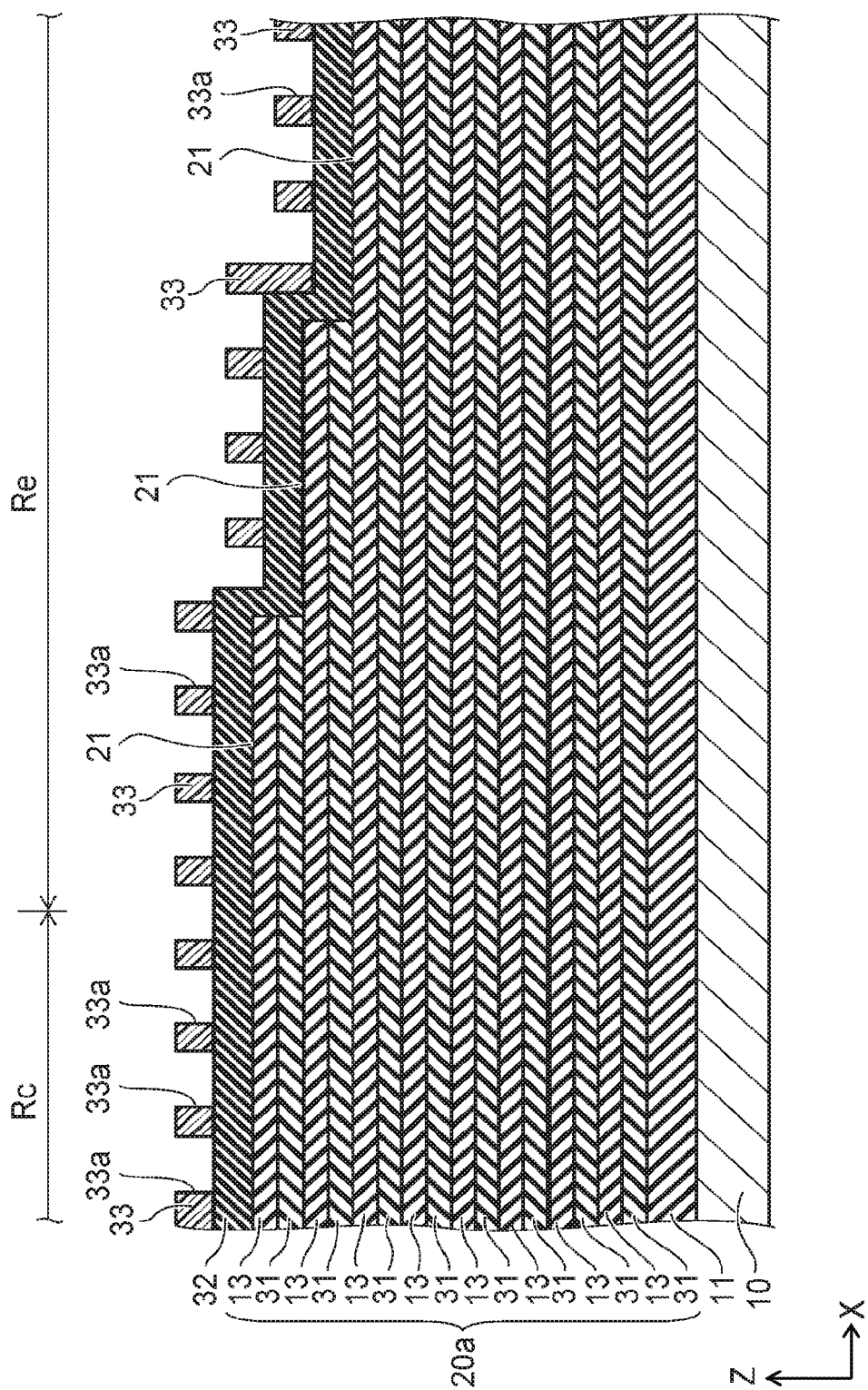
FIG. 4 is cross-sectional view showing the method for manufacturing the semiconductor memory device according to the first embodiment.

FIG. 4 shows a cross section along line A-A' of FIG. 3; FIG. 6 shows a cross section along line A-A' of FIG. 5; and FIG. 8 shows a cross section along line A-A' of FIG. 7.

First, as shown in FIG. 3 and FIG. 4, the silicon substrate 10 is prepared. Then, the silicon oxide film 11 is formed on the silicon substrate 10. Then, a stacked body 20a is formed on the silicon oxide film 11 by stacking sacrificial films 31 and the inter-layer insulating films 13 alternately by, for example, CVD (Chemical Vapor Deposition). The sacrificial films 31 are films having etching selectivity with respect to the inter-layer insulating films 13 and are formed of, for example, silicon nitride (SiN) or polysilicon (Si). Then, a resist film (not shown) is formed on the stacked body 20a; and etching using the resist film as a mask and slimming of the resist film are repeated alternately. Thereby, the two end portions in the X-direction of the stacked body 20a are patterned into a stairstep configuration; and the step 21 is formed for each of the inter-layer insulating films 13.

Then, a hard mask film 32 is formed on the stacked body 20a. For example, the hard mask film 32 is formed of a material having an etching selectivity of 10 or more with respect to the inter-layer insulating films 13 and the sacrificial films 31 and is formed of, for example, polysilicon, silicon oxide including boron (B), an organic substance including carbon, or a metal. Then, a resist mask 33 is formed on the hard mask film 32.

Then, exposure of the resist mask 33 is performed. At this time, utilizing the diffraction of light, the light is irradiated on the resist film at a portion of the lattice points Lp of the lattice La made of the imaginary straight lines L1 extending in the X-direction, the imaginary straight lines L2 extending in the U-direction intersecting the X-direction and the Y-direction, and the imaginary straight lines L3 extending in the W-direction intersecting the X-direction, the Y-direction, and the U-direction. Then, by developing the resist mask 33 after the exposure, openings 33a are made in a portion of the lattice points Lp by removing the portion of the resist mask 33 irradiated with the light. Thereby, the resist mask 33 is patterned.

Figure 5:
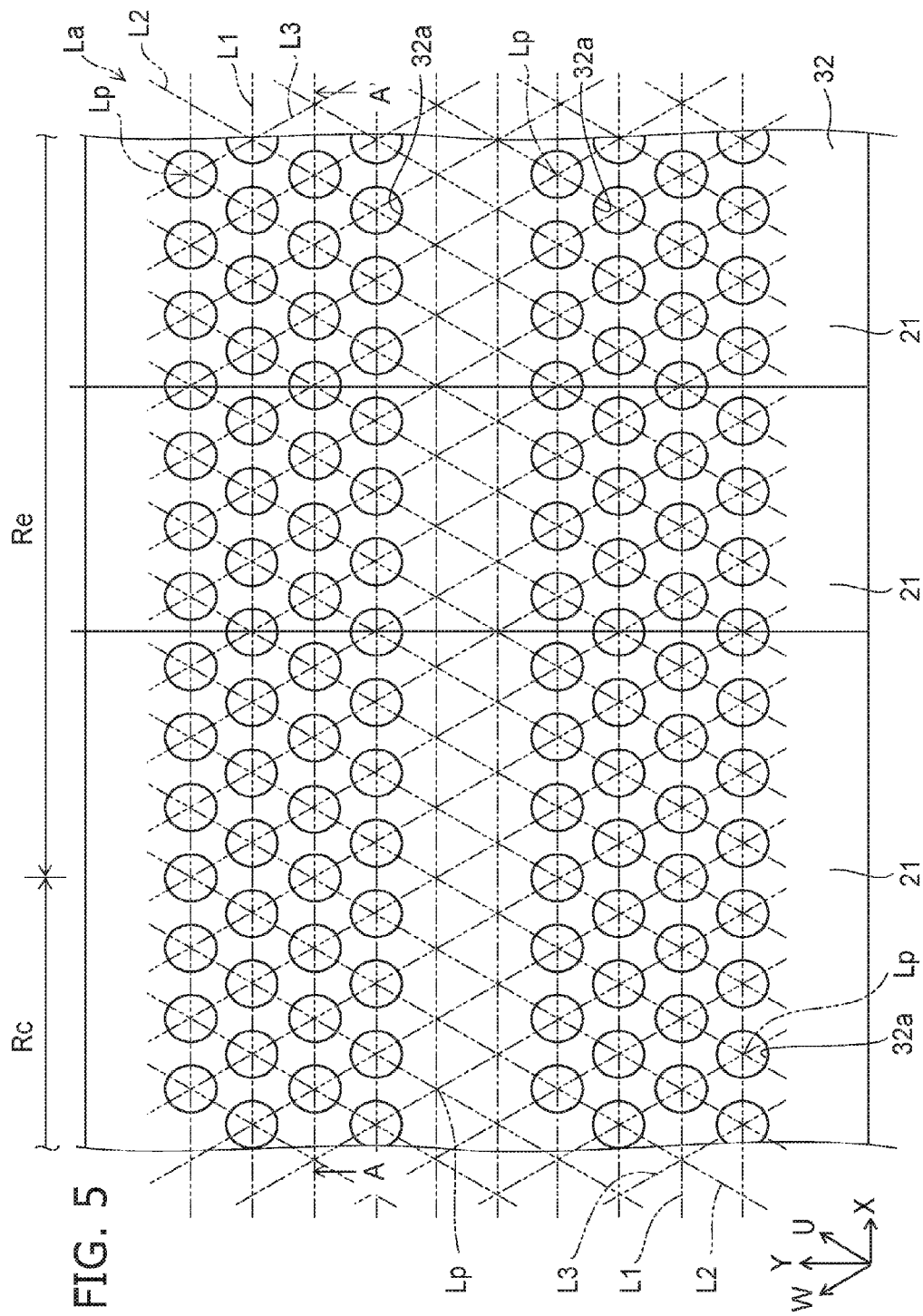
FIG. 5 is plan view showing the method for manufacturing the semiconductor memory device according to the first embodiment.
Figure 6:
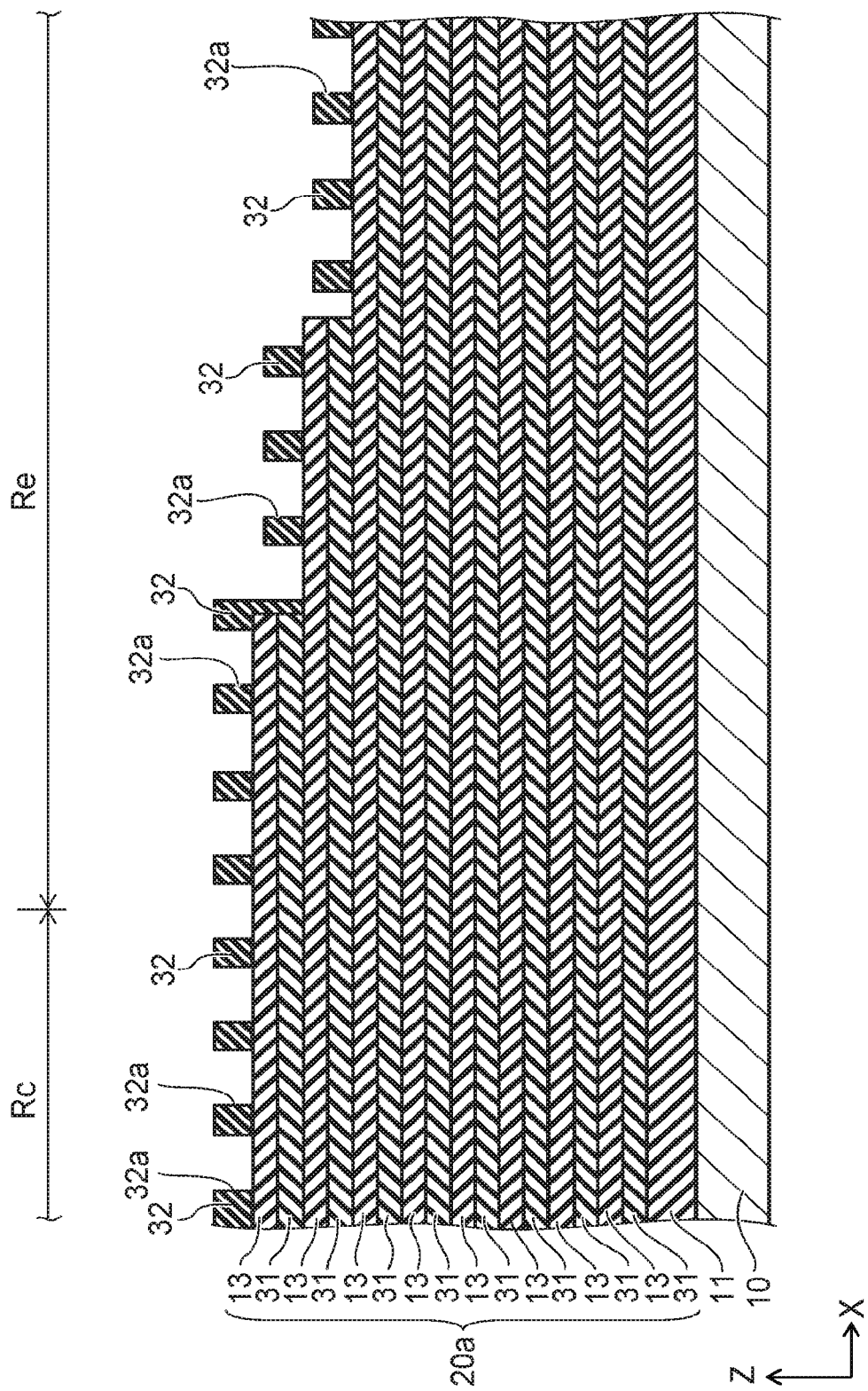
FIG. 6 is cross-sectional view showing the method for manufacturing the semiconductor memory device according to the first embodiment.

Then, as shown in FIG. 5 and FIG. 6, the pattern of the resist mask 33 is transferred onto the hard mask film 32 by performing anisotropic etching such as RIE (Reactive Ion Etching), etc., using the resist mask 33 as a mask. Thereby, the hard mask film 32 in which openings 32a are made at a portion of the lattice points Lp is formed.

Figure 7:
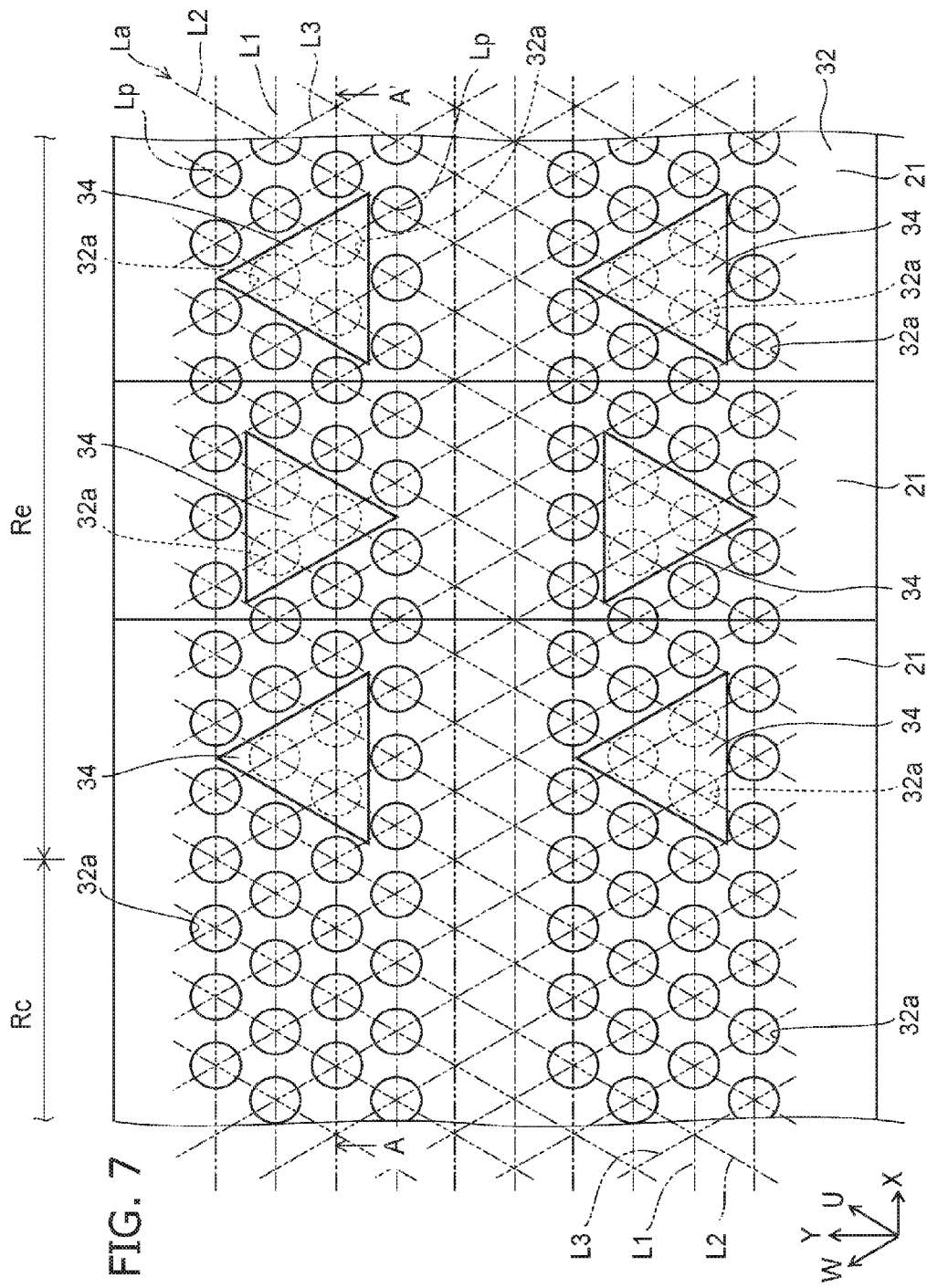
FIG. 7 is plan view showing the method for manufacturing the semiconductor memory device according to the first embodiment.
Figure 8:
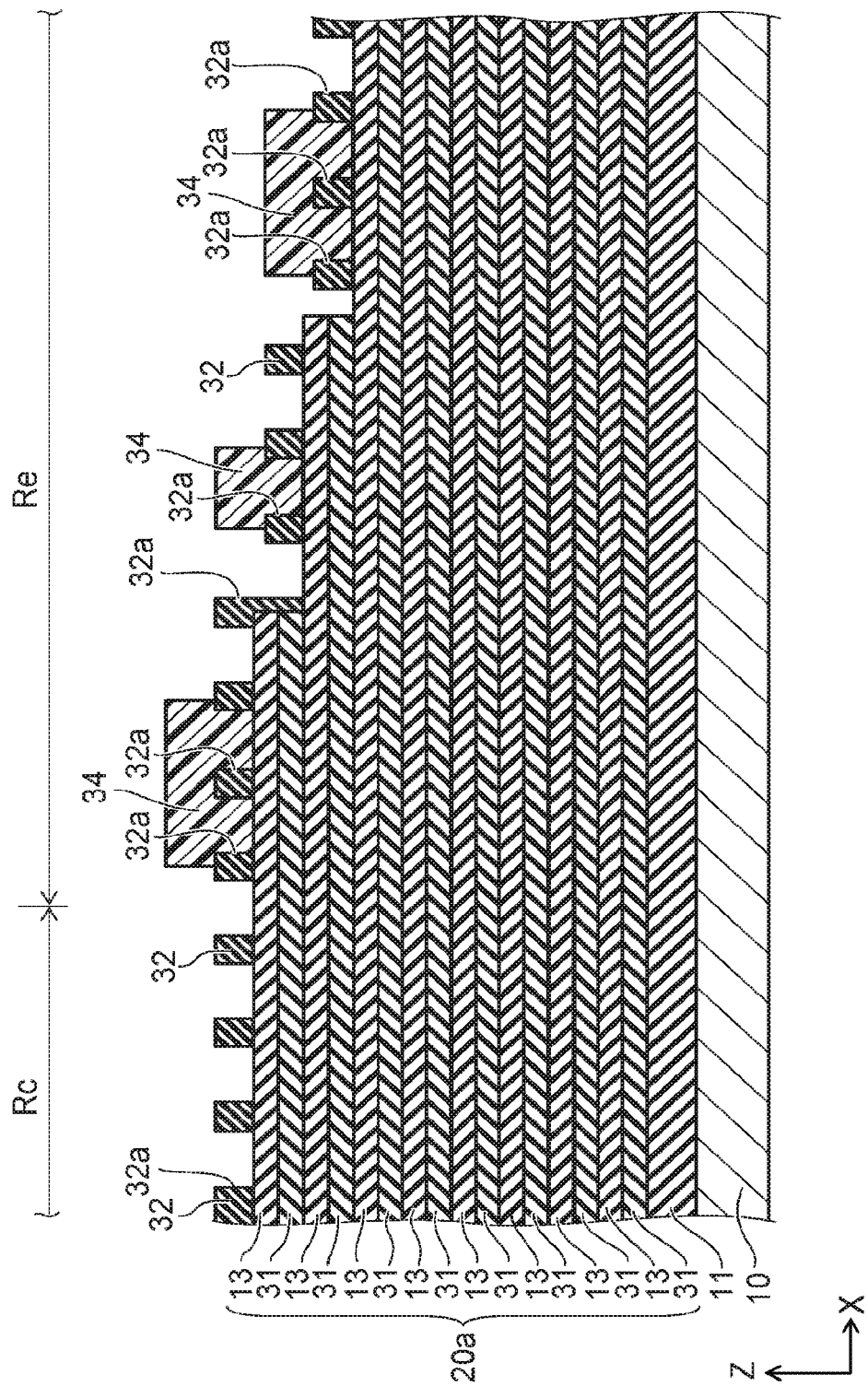
FIG. 8 to FIG. 10 are cross-sectional views showing the method for manufacturing the semiconductor memory device according to the first embodiment.

Then, as shown in FIG. 7 and FIG. 8, a local mask film 34 is formed for each of the steps 21 to cover at least one, e.g., at least three, of the openings 32a. For example, the local mask film 34 is formed by patterning the resist film using lithography. In the embodiment, one local mask film 34 that is an equilateral triangle that covers three openings 32a disposed at the vertices of the equilateral triangle is formed for each of the steps 21.

Figure 9:
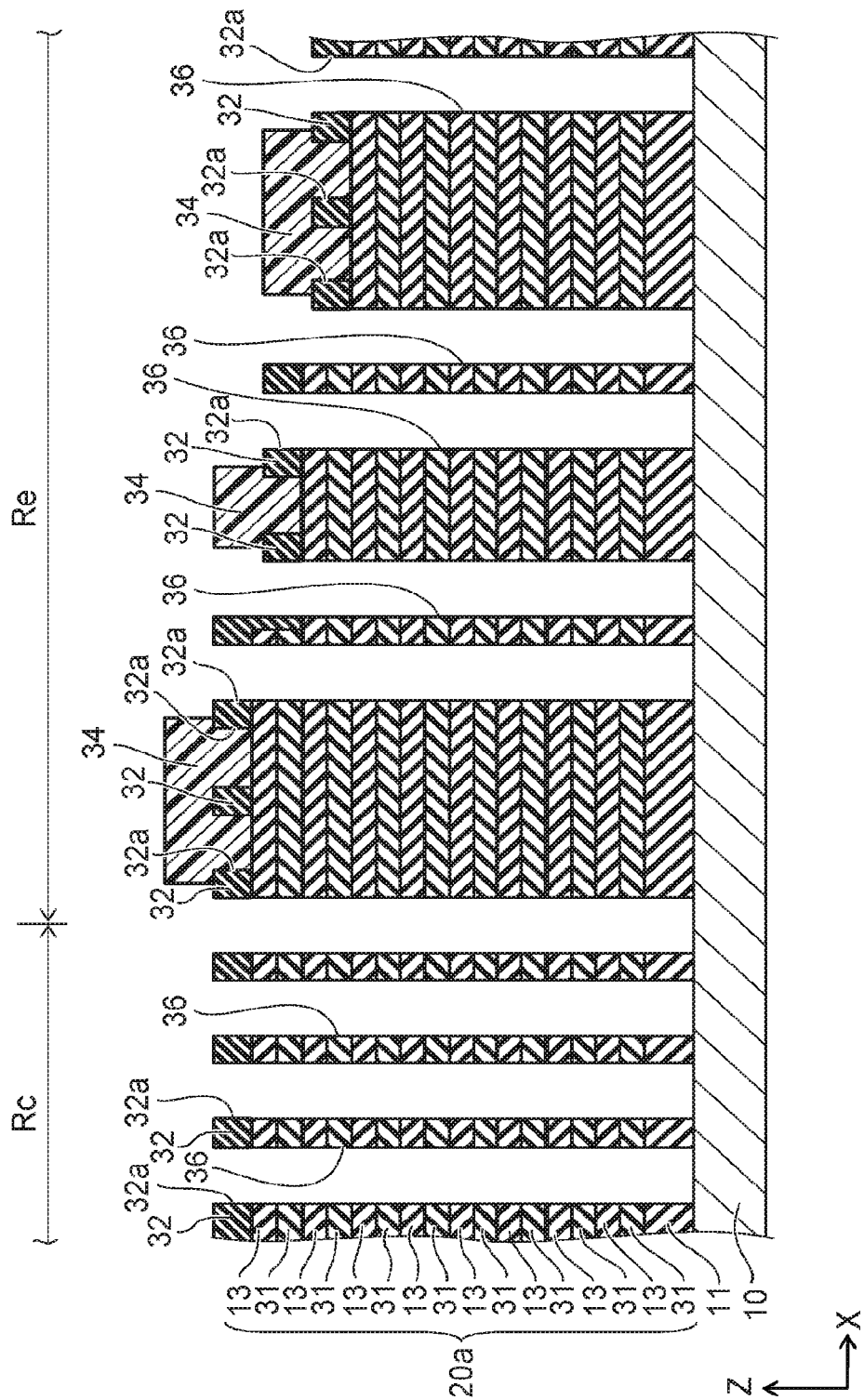

Then, as shown in FIG. 9, memory holes 36 are made in the stacked body 20a by performing anisotropic etching such as RIE, etc., using the hard mask film 32 and the local mask films as a mask. The memory holes 36 reach the silicon substrate 10. At this time, because the memory holes 36 are not made in the regions covered with the local mask films 34, a large empty region where the memory holes 36 are not disposed is made in each of the steps 21. Subsequently, the local mask films 34 and the hard mask film 32 are removed.

Figure 10:
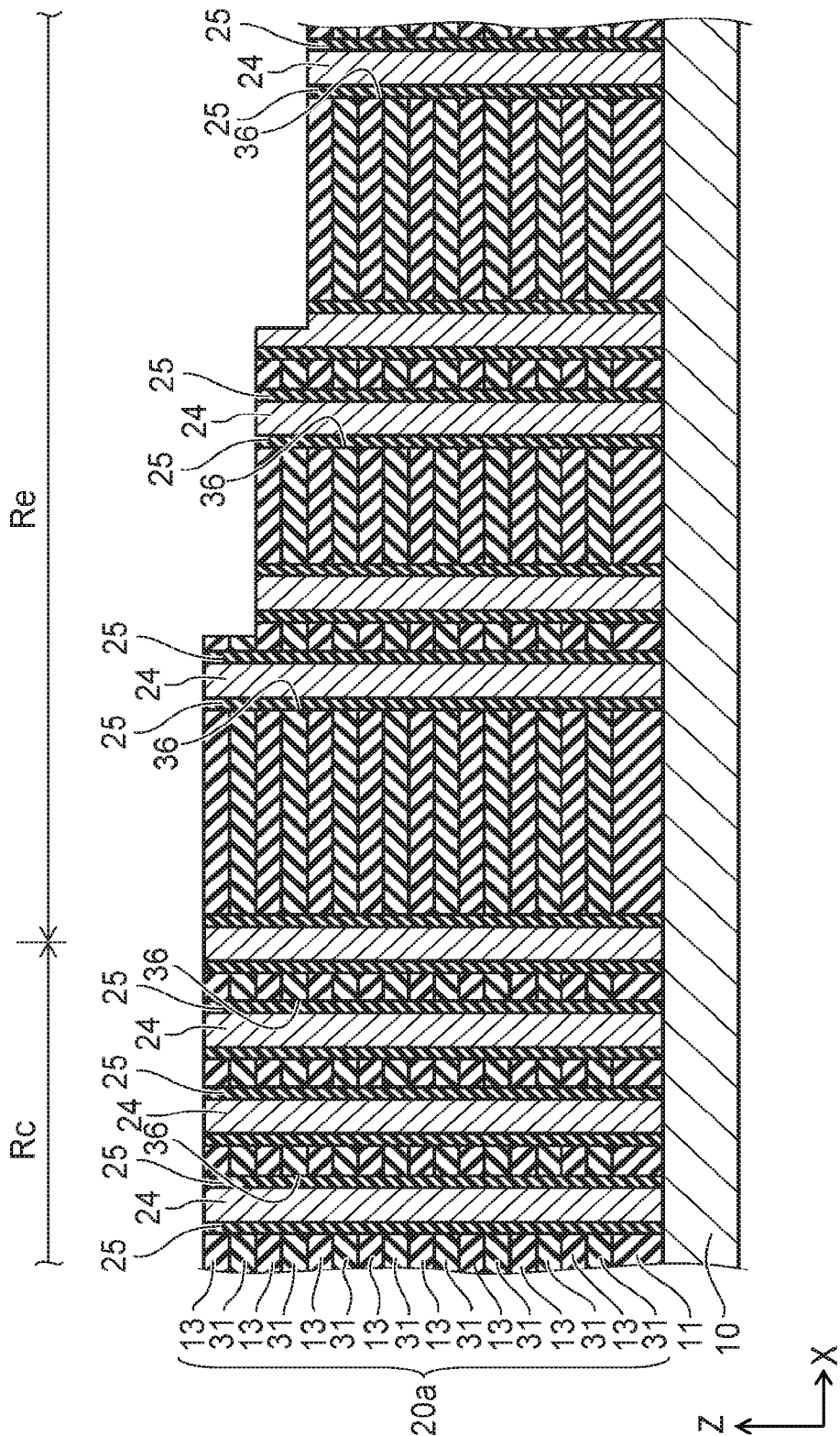

Then, as shown in FIG. 10, the memory film 25 is formed by stacking a blocking insulating film, a charge storage film, and a tunneling insulating film in this order on the inner surface of the memory hole 36. Then, the silicon pillar 24 is formed by depositing silicon on the memory film 25. The lower end of the silicon pillar 24 is connected to the silicon substrate 10. The silicon pillar 24 may be formed in a circular columnar configuration that fills the interior of the memory hole 36 or may be formed in a cylindrical configuration along the memory film 25. In the case where the silicon pillar 24 is formed in the cylindrical configuration, an insulating member is formed in the interior of the silicon pillar 24.

Figure 11:
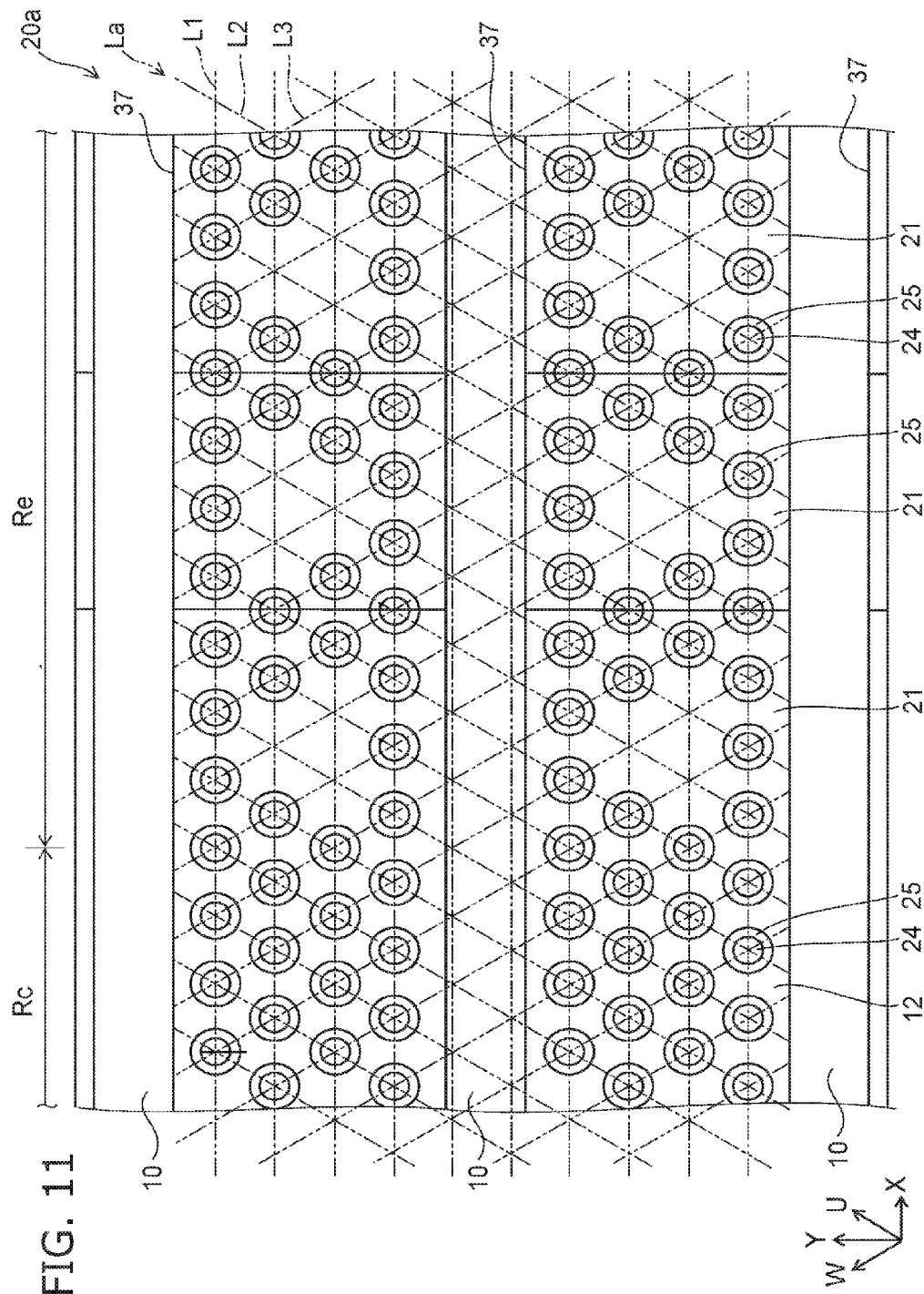
FIG. 11 is plan view showing the method for manufacturing the semiconductor memory device according to the first embodiment.

Then, as shown in FIG. 11, slits 37 that extend in the X-direction are multiply made in the stacked body 20a. The slits 37 pierce the stacked body 20a and the silicon oxide film 11 and reach the silicon substrate 10. The multiple silicon pillars 24 are disposed between the slits 37 adjacent to each other in the Y-direction.

Figure 12:
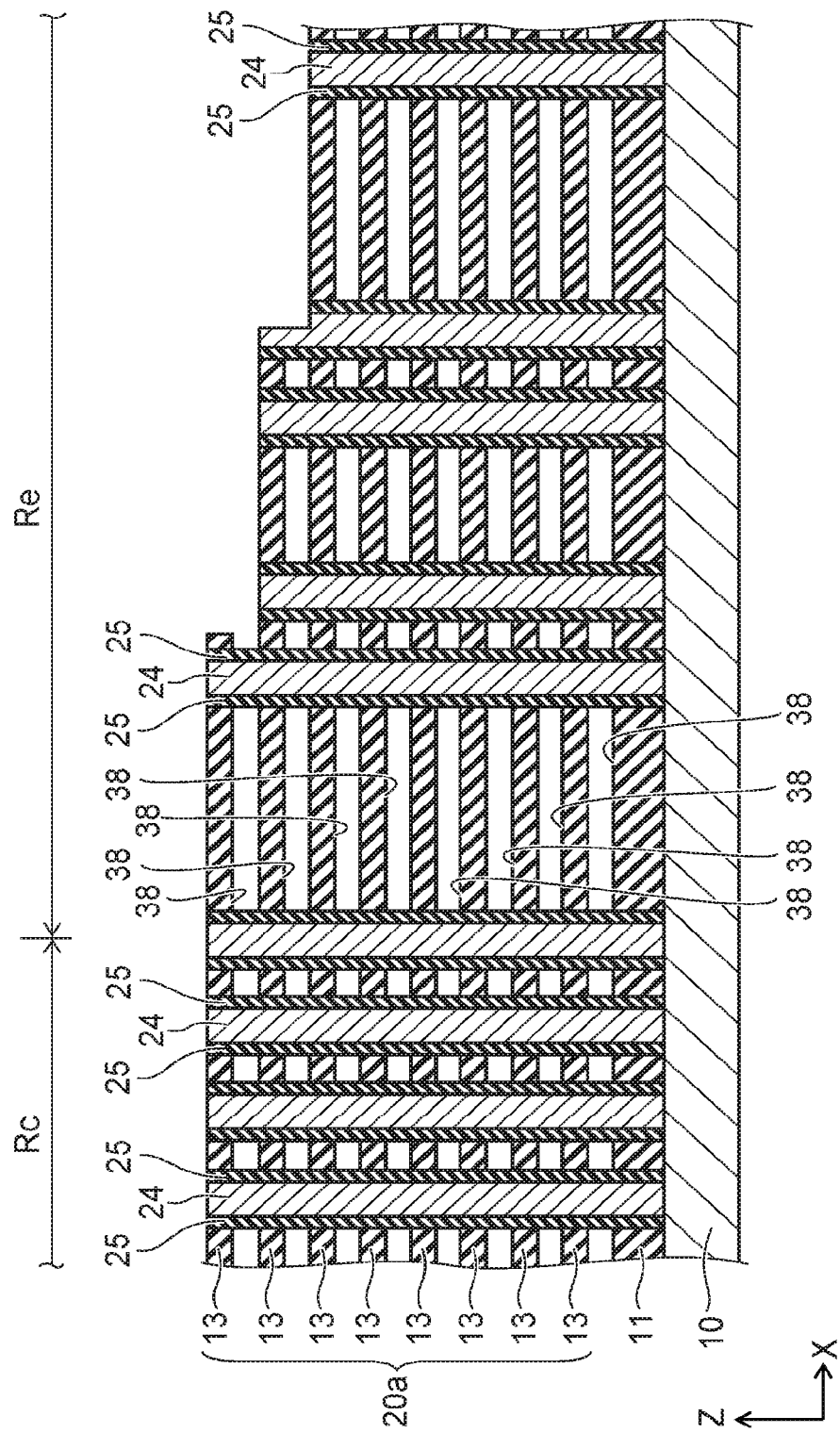
FIG. 12 and FIG. 13 are cross-sectional views showing the method for manufacturing the semiconductor memory device according to the first embodiment.

Then, as shown in FIG. 12, the sacrificial films 31 (referring to FIG. 11) are removed by performing isotropic etching via the slits 37 (referring to FIG. 11). For example, in the case where the sacrificial films 31 are formed of silicon nitride, wet etching is performed using hot phosphoric acid as the etchant. Thereby, spaces 38 are made between the inter-layer insulating films 13 adjacent to each other in the Z-direction. At this time, the memory films 25 and the silicon pillars 24 are not removed; and the silicon pillars 24 formed in the cell region Rc and the draw-out region Re function as posts supporting the inter-layer insulating films 13. As a result, the stacked body in which the inter-layer insulating films 13 are stacked with the spaces 38 interposed can be prevented from collapsing.

Figure 13:
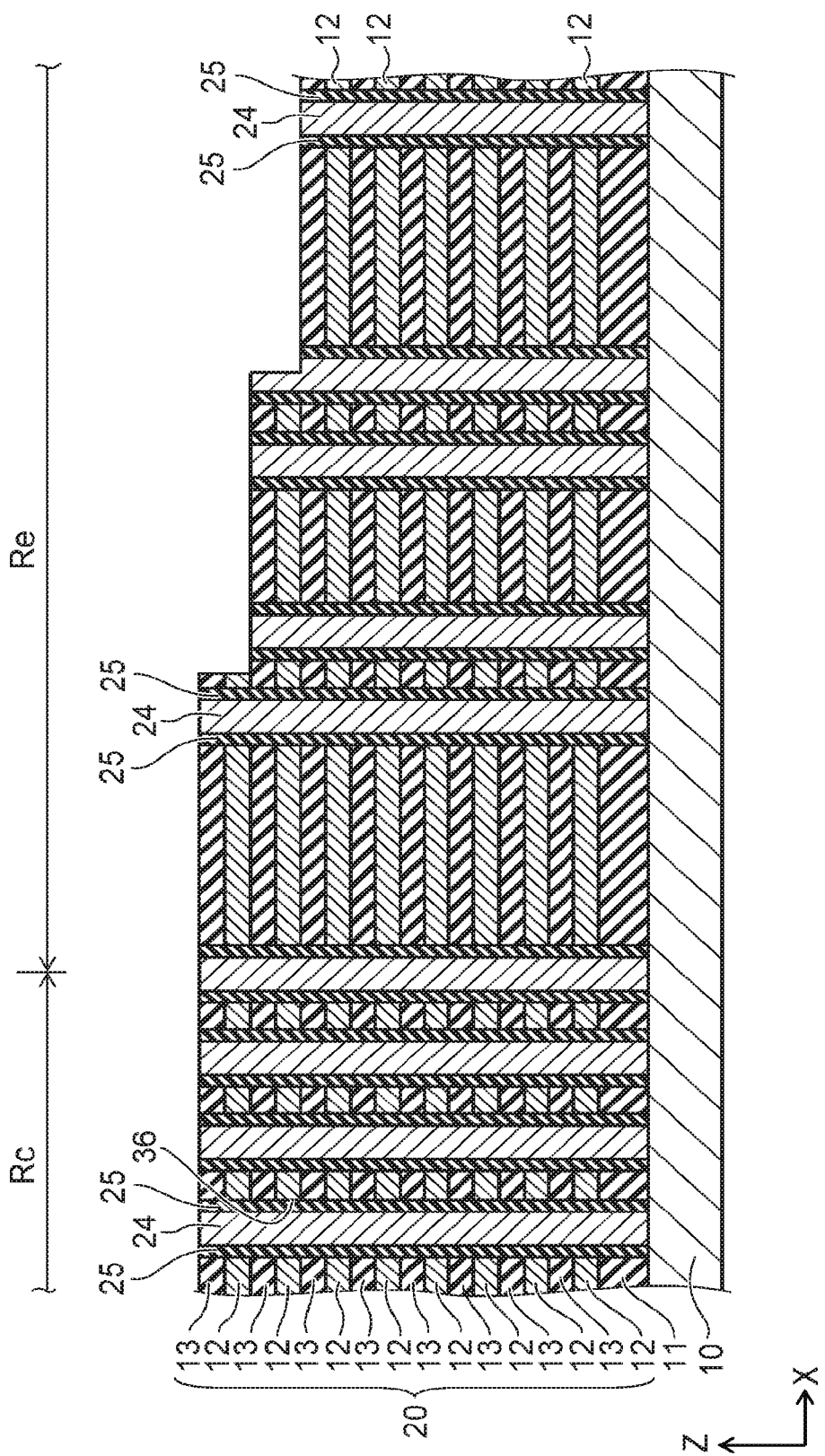

Then, as shown in FIG. 13, the electrode films 12 are formed by depositing a conductive material inside the spaces 38 via the slits 37 (referring to FIG. 11). For example, a barrier metal layer (not shown) that is made of titanium nitride is formed on the inner surfaces of the spaces 38 and on the exposed surfaces of the memory film 25; and a main body unit (not shown) is formed on the barrier metal layer by depositing tungsten. Then, the electrode films 12 are divided for each of the spaces 38 by removing the conductive material deposited inside the slits 37 by etching. Thereby, the stacked body 20 is formed.

Then, as shown in FIG. 1 and FIG. 2, the inter-layer insulating film 17 is formed to cover the stacked body 20. Then, plug holes 41 and contact holes 42 are made in the inter-layer insulating film 17 by, for example, lithography and RIE. The plug hole 41 is made in the region directly above each of the silicon pillars 24 in the cell region Rc. The contact hole 42 is made in the region directly above each of the steps 21 in the draw-out region Re where the local mask film 34 is disposed in the process shown in FIG. 9. Also, the diameter of the contact hole 42 is set to be not less than the distance between the mutually-adjacent lattice points Lp.

Then, the plugs 18 are formed inside the plug holes 41 and the contacts 27 are formed inside the contact holes 42 by filling a conductive material into the plug holes 41 and into the contact holes 42. The plugs 18 pierce the inter-layer insulating film 17 and are connected to the silicon pillars 24. The contacts 27 pierce the inter-layer insulating film 17 and are connected to the electrode films 12.

Then, the bit lines 19 that extend in the Y-direction are formed on the inter-layer insulating film 17 in the cell region Rc. The bit lines 19 are connected to the plugs 18. Thus, the semiconductor memory device 1 according to the embodiment is manufactured.

Effects of the embodiment will now be described.

In the embodiment, the openings 33a are made in both the cell region Rc and the draw-out region Re in the process shown in FIG. 3 and FIG. 4. Thereby, the memory films 25 and the silicon pillars 24 can be formed in both the cell region Rc and the draw-out region Re in the process shown in FIG. 9 and FIG. 10. Also, the silicon pillars 24 that are formed in the cell region Rc function as posts supporting the inter-layer insulating films 13 in the replace process shown in FIG. 12 and function as bodies of the NAND strings after the completion of the semiconductor memory device 1. On the other hand, the silicon pillars 24 that are formed in the draw-out region Re do not function as NAND strings but function as the posts supporting the inter-layer insulating films 13 in the replace process shown in FIG. 12. Thus, according to the embodiment, the posts/bodies of the cell region Rc and the posts of the draw-out region Re can be formed simultaneously. Also, because the openings 33a are made in both the cell region Rc and the draw-out region Re based on a single pattern, the process conditions can be uniform when making the memory holes 36; and the patterning is easy.

Also, the openings 33a are made at a portion of the lattice points Lp of the lattice La in the process shown in FIG. 3 and FIG. 4. Therefore, the diffraction of the light can be utilized in the exposure for making the openings 33a; and the exposure is easy. Also, the local mask film 34 is formed to cover a portion of the openings 32a in the process shown in FIG. 7 and FIG. 8. Therefore, the memory holes 36 can be impeded from being made through the portion of the openings 32a; and empty regions for forming the contacts 27 can be ensured. On the other hand, because the memory holes 36 are made in the region of the draw-out region Re not covered with the local mask film 34 and the silicon pillars 24 are formed inside the memory holes 36, the silicon pillars 24 function as the posts supporting the inter-layer insulating films 13 in the process shown in FIG. 12. Thereby, the stacked body 20a can be prevented from collapsing in the process shown in FIG. 12.

In particular, in the embodiment, because the silicon pillars 24 are formed in each step 21 at the tip portions of the inter-layer insulating films 13, i.e., on the side distal to the cell region Rc and on the slit 37 side, the collapse of the inter-layer insulating films 13 can be prevented with higher certainty.

Second Embodiment

A second embodiment will now be described.

Figure 14:
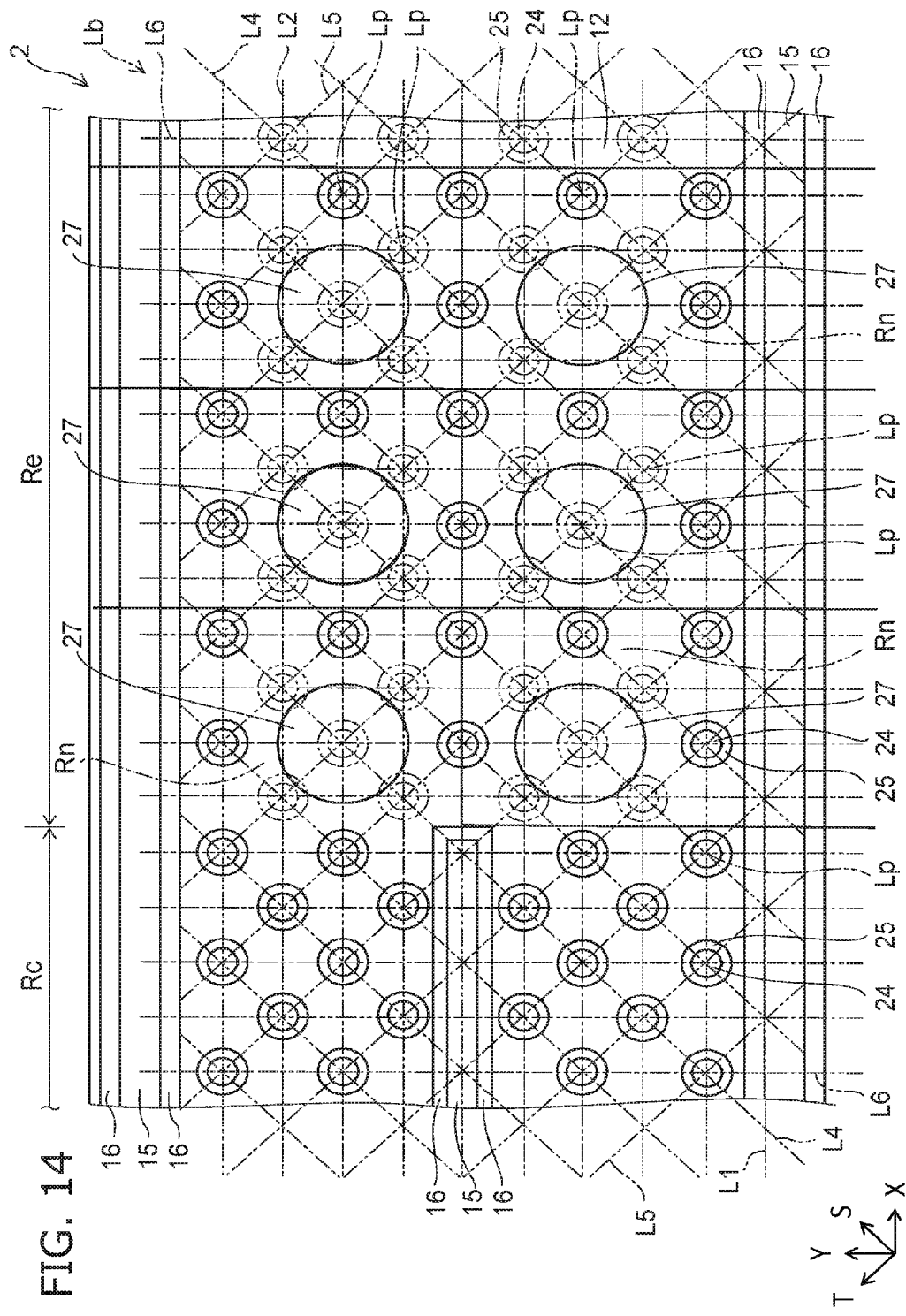
FIG. 14 is a plan view showing a semiconductor memory device according to a second embodiment.

FIG. 14 is a plan view showing a semiconductor memory device according to the embodiment.

In the semiconductor memory device 2 according to the embodiment as shown in FIG. 14, when viewed from the Z-direction, the silicon pillars 24 are disposed at a portion of the lattice points Lp of a lattice Lb made of imaginary straight lines L4 extending in an S-direction and imaginary straight lines L5 extending in a T-direction. The S-direction is a direction that is orthogonal to the Z-direction and tilted 45° counterclockwise in the illustration with respect to the X-direction. The T-direction is a direction that is orthogonal to the Z-direction and tilted 45° counterclockwise in the illustration with respect to the Y-direction. Accordingly, the S-direction and the T-direction are orthogonal to each other.

Also, when viewed from the Z-direction, five lattice points Lp are disposed inside the contact 27 and inside the proximal region Rn. Four of the five lattice points Lp are positioned at the vertices of the square configured by the imaginary straight lines L1 extending in the X-direction and imaginary straight lines L6 extending in the Y-direction; and the remaining one of the five lattice points Lp is positioned at the center of the square. The silicon pillars 24 are not disposed at the five lattice points Lp.

Further, in the semiconductor memory device 2, a portion of the source electrode 15 and insulating members 16 is disposed only in the cell region Rc and is terminated at the boundary between the cell region Rc and the draw-out region Re. Also, the steps 21 are disposed not only along the X-direction but also along the Y-direction. Even in such a case, at least one silicon pillar 24 is disposed in each of the steps 21 between the contact 27 and the insulating member 16 and on the side distal to the cell region Rc as viewed from the contact 27.

A method for manufacturing the semiconductor memory device according to the embodiment will now be described.

Figure 15:
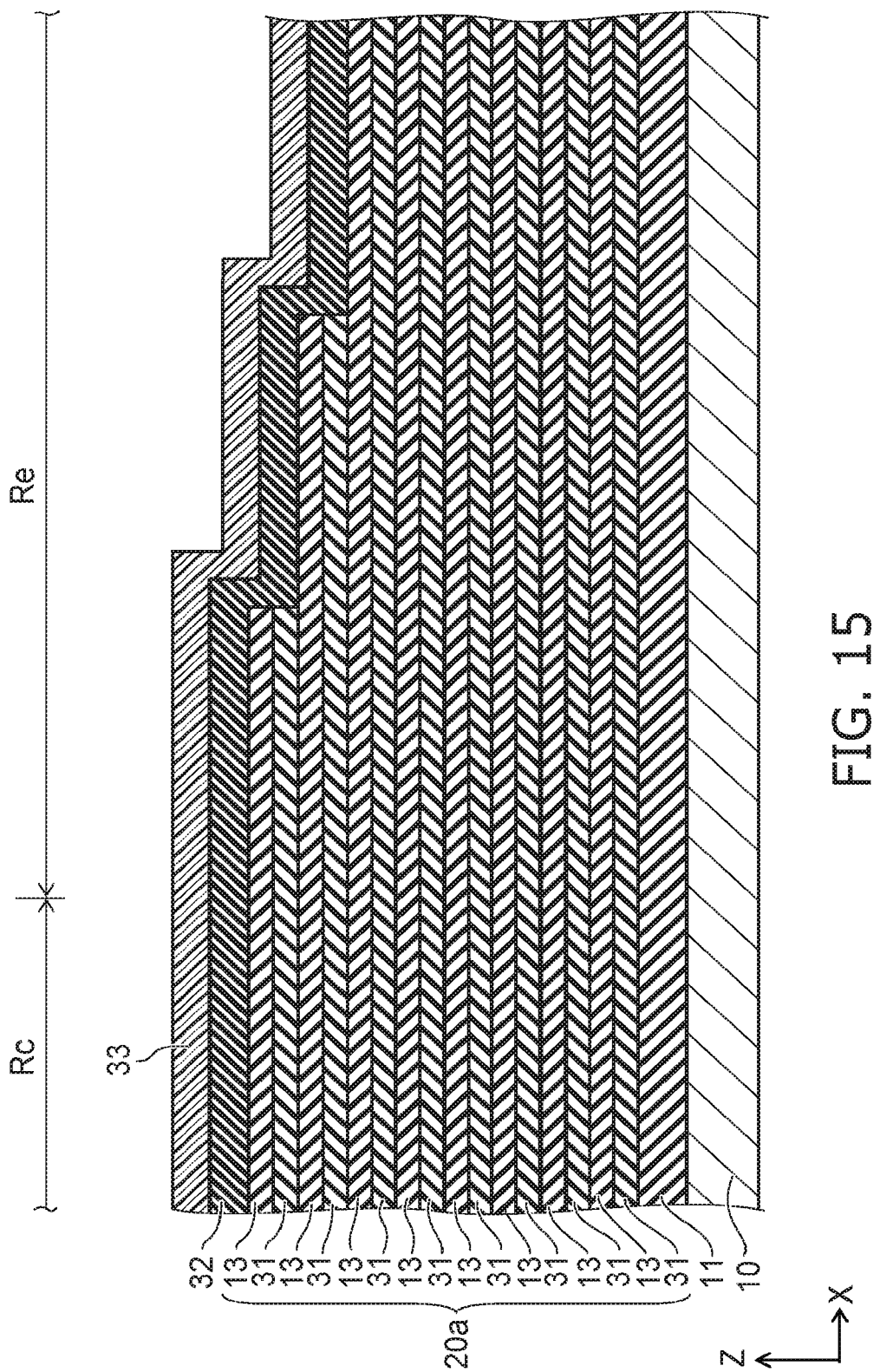
FIG. 15 is a cross-sectional view showing a method for manufacturing the semiconductor memory device according to the second embodiment.

FIG. 15 is a cross-sectional view showing the method for manufacturing the semiconductor memory device according to the embodiment.

Figure 16:
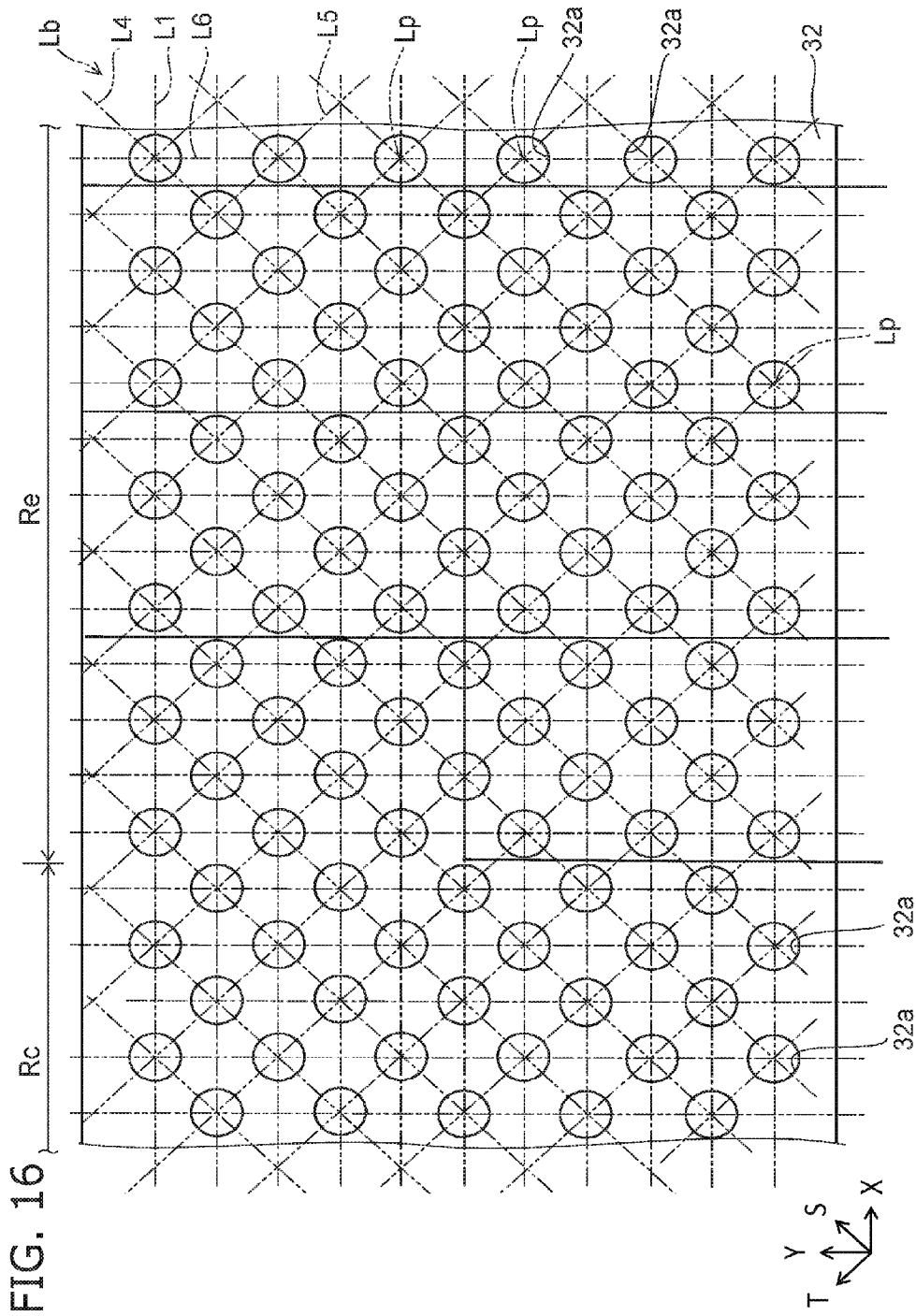
FIG. 16 and FIG. 17 are plan views showing the method for manufacturing the semiconductor memory device according to the second embodiment.
Figure 17:
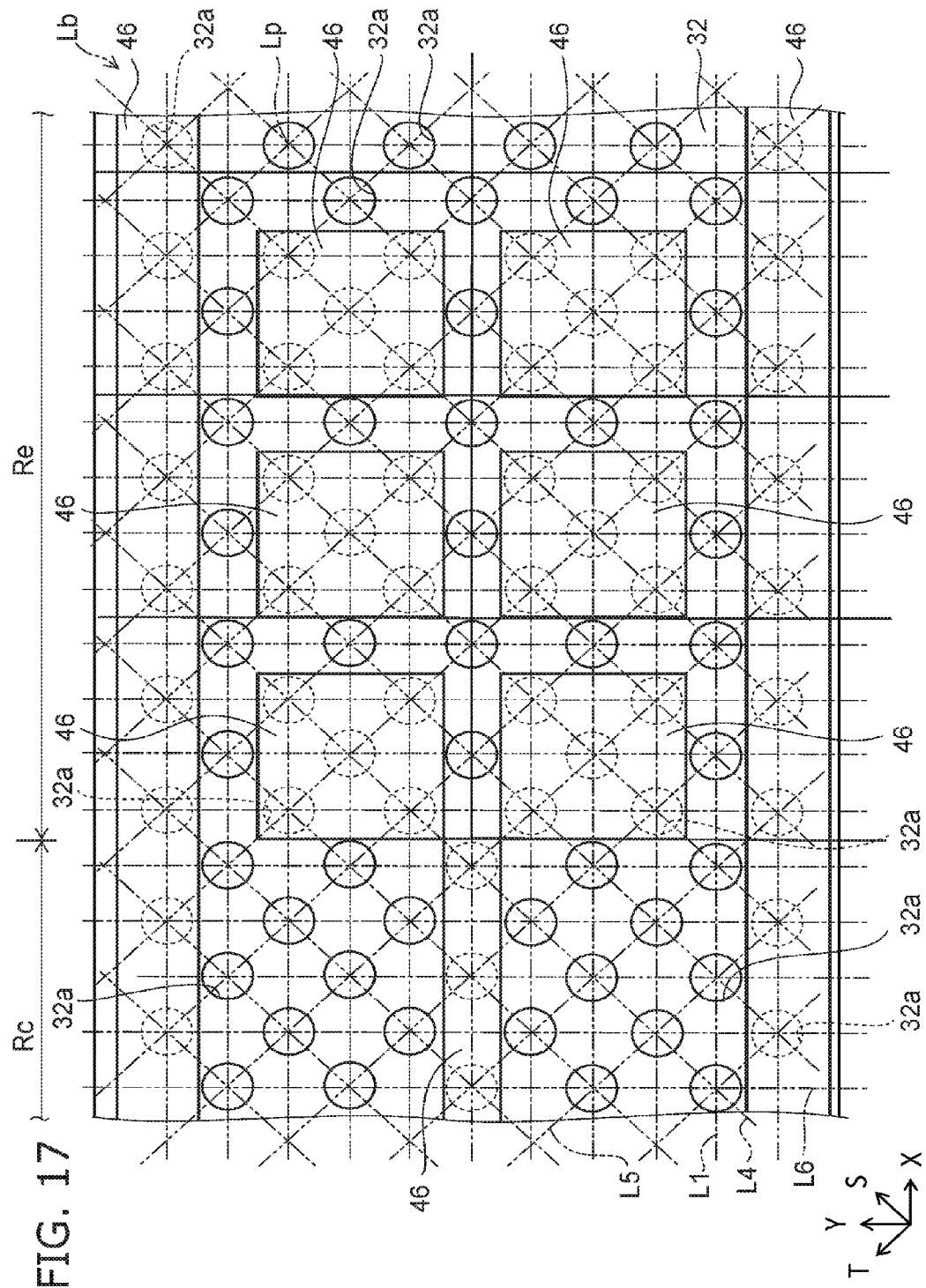

FIG. 16 and FIG. 17 are plan views showing the method for manufacturing the semiconductor memory device according to the embodiment.

First, as shown in FIG. 15, the silicon oxide film 11 is formed on the silicon substrate 10; and the stacked body 20a in which the sacrificial films 31 and the inter-layer insulating films 13 are stacked alternately is formed on the silicon oxide film 11. Then, the hard mask film 32 is formed on the stacked body 20a; and the resist mask 33 is formed as a continuous film on the hard mask film 32.

Then, as shown in FIG. 16, exposure of the resist film is performed; and light is irradiated at all of the lattice points Lp of the lattice Lb. Thereby, openings are made in the resist mask 33 in the regions corresponding to all of the lattice points Lp. Then, the pattern of the resist mask 33 is transferred onto the hard mask film 32 by performing etching using the resist mask 33 as a mask. Thereby, the hard mask film 32 in which the openings 32a are made at all of the lattice points Lp of the lattice Lb is formed.

Then, as shown in FIG. 17, local mask films 46 are formed on the hard mask film 32 in the regions where the contacts 27 (referring to FIG. 14) are to be formed and in the regions where the source electrode 15 and the insulating members 16 (referring to FIG. 14) are to be formed. In the region where the contact 27 is to be formed, the local mask film 46 is formed as a square; and five lattice points Lp are disposed in the square interior. For example, the local mask film 46 is formed of a resist material.

The subsequent processes are similar to those of the first embodiment described above.

Otherwise, the configuration, the manufacturing method, the operations, and the effects of the embodiment are similar to those of the first embodiment described above.

Third Embodiment

A third embodiment will now be described.

The configuration of a semiconductor memory device according to the embodiment is similar to that of the semiconductor memory device 1 according to the first embodiment described above (referring to FIG. 1 and FIG. 2).

The method for manufacturing the semiconductor memory device according to the embodiment will now be described.

Figure 18:
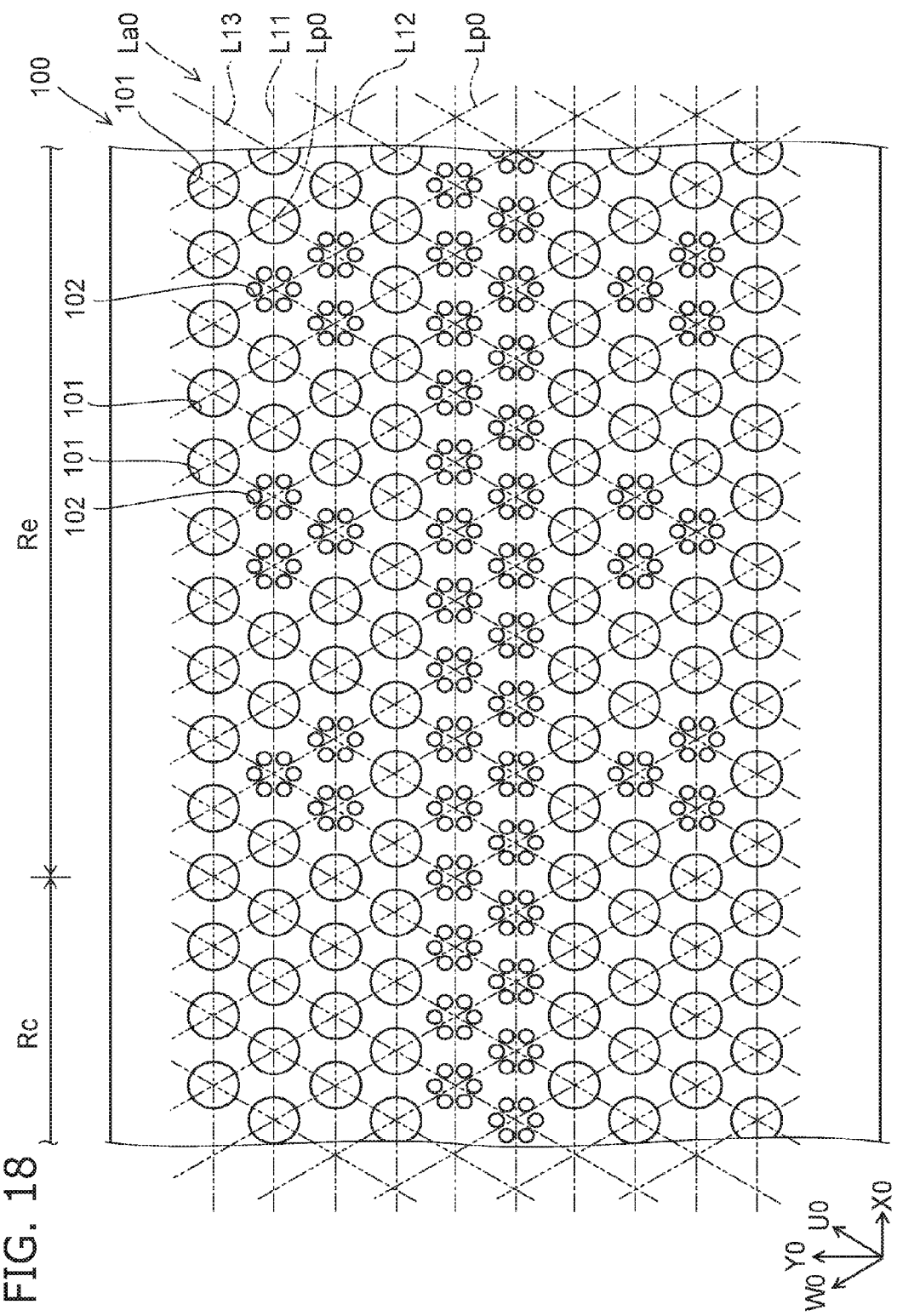
FIG. 18 is a plan view showing an exposure mask used in a third embodiment.

FIG. 18 is a plan view showing the exposure mask used in the embodiment.

Figure 19:
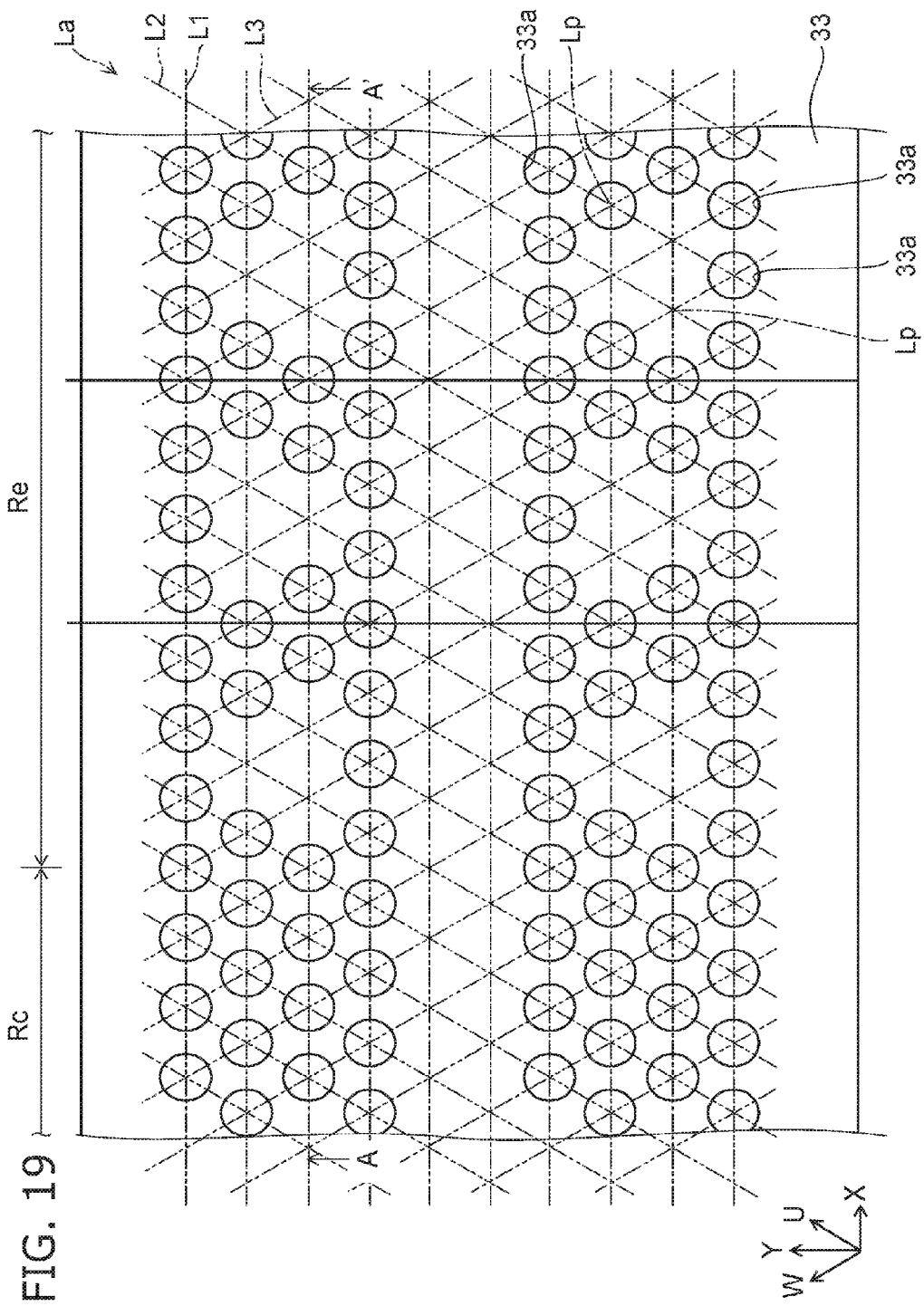
FIG. 19 is a plan view showing a method for manufacturing a semiconductor memory device according to the third embodiment.

FIG. 19 is a plan view showing the method for manufacturing the semiconductor memory device according to the embodiment.

Figure 20:
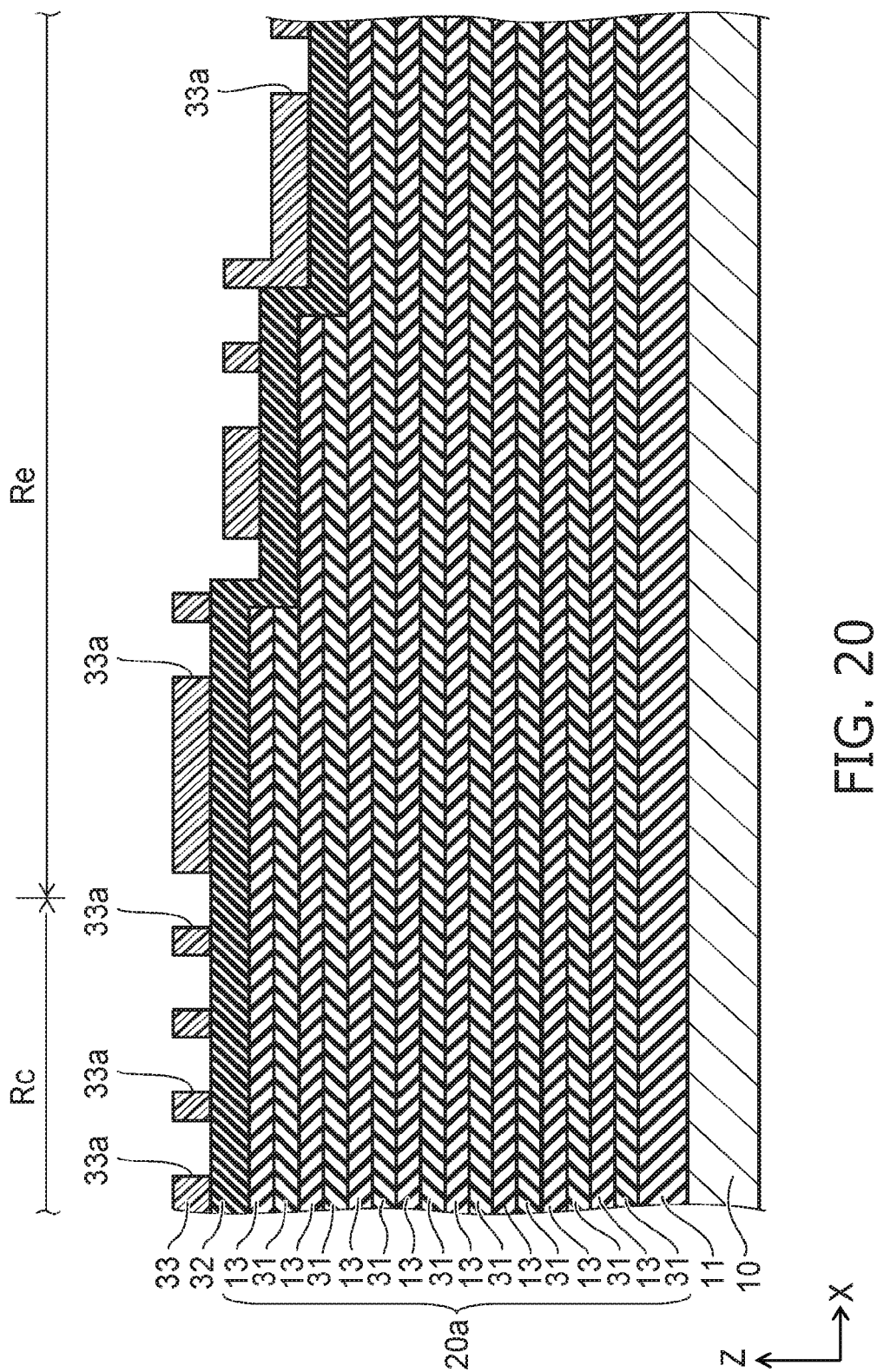
FIG. 20 is a cross-sectional view showing the method for manufacturing the semiconductor memory device according to the third embodiment and shows a cross section along line A-A' of FIG. 19.

FIG. 20 is a cross-sectional view showing the method for manufacturing the semiconductor memory device according to the embodiment and shows a cross section along line A-A' of FIG. 19.

First, the process shown in FIG. 15 is implemented.

Then, the resist mask 33 is exposed. An exposure mask 100 shown in FIG. 18 is used in the exposure.

As shown in FIG. 18, a pattern 101 that is resolved in the exposure or a pattern 102 that is not resolved in the exposure is formed in the exposure mask 100 to correspond to lattice points Lp0 of a lattice La0 made of imaginary straight lines L11 extending in an X0-direction, imaginary straight lines L12 extending in a U0-direction, and imaginary straight lines L13 extending in a W0-direction. The X0-direction, the U0-direction, and the W0-direction of the exposure mask 100 are optically equivalent respectively to the X-direction, the U-direction, and the W-direction of the semiconductor memory device 1 in the exposure. Also, the straight lines L11, L12, and L13 of the exposure mask 100 are optically equivalent respectively to the straight lines L1, L2, and L3 of the semiconductor memory device 1 in the exposure. Accordingly, the lattice La0 of the exposure mask 100 is optically equivalent to the lattice La of the semiconductor memory device 1; and the lattice points Lp0 correspond to the lattice points Lp.

The pattern 102 that is not resolved in the exposure is, for example, a SRAF (Sub Resolution Assist Feature). Although the pattern 101 that is resolved is shown as a relatively large circle and the pattern 102 that is not resolved is shown as a relatively small circle in FIG. 18 for convenience of illustration, the configurations of the actual patterns 101 and 102 are not limited to circles because the configurations are dependent on the size and arrangement period of the openings 33a to be made, the exposure conditions, etc.

The resist pattern 33 is exposed using the exposure mask 100 shown in FIG. 18; and subsequently, by developing as shown in FIG. 19 and FIG. 20, the openings 33a are made in the regions of the resist pattern 33 corresponding to the pattern 101; and the openings 33 are not made in the regions of the resist pattern 33 corresponding to the pattern 102.

Then, the pattern of the resist pattern 33 is transferred onto the hard mask film 32. Thereby, the openings 32a are made in the hard mask film 32 at a portion of the lattice points Lp of the lattice La; and the openings 32a are not made at the other lattice points Lp.

Then, etching of the stacked body 20a is performed using the hard mask film 32 as a mask. Thereby, the memory holes 36 are made in the regions of the stacked body 20a directly under the openings 32a.

The subsequent processes are similar to those of the first embodiment described above.

Effects of the embodiment will now be described.

In the embodiment, the manufacturing processes can be simplified compared to the first embodiment described above because it is unnecessary to form the local mask films.

Also, because the pattern 102 that is not resolved is formed in the exposure mask 100 at the lattice points Lp of the lattice La where the pattern 101 is not formed, the aperture ratio is uniform over the entire exposure mask 100. Thereby, the exposure can be performed using uniform conditions.

Otherwise, the configuration, the manufacturing method, the operations, and the effects of the embodiment are similar to those of the first embodiment described above.

Although an example is illustrated in the embodiments described above in which at least one type of straight line of the imaginary straight lines included in the lattice extends in a direction intersecting the X-direction and the Y-direction, the invention is not limited thereto; and the openings 32a may be made at a portion of the lattice points of the lattice configured by imaginary straight lines extending in the X-direction and imaginary straight lines extending in the Y-direction.

Also, although an example is illustrated in the embodiments described above in which the silicon pillars 24 are connected to the silicon substrate 10, the invention is not limited thereto; and, for example, a source electrode film that is connected to the source electrode 15 may be provided on the silicon substrate 10; and the silicon pillars 24 may be connected to the source electrode film.

Further, although an example is illustrated in the embodiments described above in which the memory films 25 are formed on the inner surfaces of the memory holes 36, the invention is not limited thereto; and the memory films 25 may be deposited via the slits 37 and the spaces 38 after the sacrificial films 31 are removed and prior to forming the electrode films 12. Also, a portion of the layers of the multiple layers included in the memory film 25 may be formed on the inner surface of the memory hole 36; and the remaining layers may be deposited via the slits 37 and the spaces 38.

According to the embodiments described above, a semiconductor memory device having high productivity and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
    a stacked body including a plurality of insulating films and a plurality of electrode films, each of the plurality of insulating films and each of the plurality of electrode films being stacked alternately along a first direction, a configuration of an end portion of the stacked body in a second direction being a stairstep configuration, the second direction being orthogonal to the first direction, a step being formed in the stairstep configuration for each of the electrode films;
    a plurality of first semiconductor pillars disposed in a first region of the stacked body where the steps are not formed, the plurality of first semiconductor pillars extending in the first direction and piercing the stacked body;
    a first memory film formed between one of the first semiconductor pillars and one of the electrode films;
    a plurality of second semiconductor pillars disposed in a second region of the stacked body where the steps are formed, the plurality of second semiconductor pillars extending in the first direction and piercing the stacked body; and
    a contact disposed on the electrode film and connected to the electrode film for each of the steps,
    when viewed from the first direction, the plurality of first semiconductor pillars and the plurality of second semiconductor pillars being disposed at some of lattice points of a lattice, the lattice being made of first imaginary straight lines extending in a third direction and second imaginary straight lines extending in a fourth direction intersecting the third direction, an arrangement period of the lattice points in the first region where the plurality of first semiconductor pillars are disposed at some of the lattice points being equal to an arrangement period of the lattice points in the second region where the plurality of second semiconductor pillars are disposed at some of the lattice points, the contact being disposed at a position including other of the lattice points, the second semiconductor pillars not being disposed at the lattice points included in the contact, plural pillars of the plurality of second semiconductor pillars being disposed at each of the steps along at least one of the third direction and the fourth direction.

2. The semiconductor memory device according to claim 1, wherein
    when viewed from the first direction, a diameter of the contact is not less than a distance between the lattice points, and
    at least three of the lattice points are disposed in an interior of the contact and in a proximal region between the contact and the second semiconductor pillars, the second semiconductor pillars not being disposed at the at least three of the lattice points.

3. The semiconductor memory device according to claim 2, wherein, when viewed from the first direction, three of the lattice points are disposed inside the contact and inside the proximal region, and the three of the lattice points are positioned at vertices of an equilateral triangle.

4. The semiconductor memory device according to claim 2, wherein, when viewed from the first direction, five of the lattice points are disposed inside the contact and inside the proximal region, four of the five of the lattice points are positioned at vertices of a square, and one of the five of the lattice points is positioned at a center of the square.

5. The semiconductor memory device according to claim 1, wherein at least one of the second semiconductor pillars is disposed, in each of the steps, on a side of the contact distal to the first region of the stacked body where the steps are not formed.

6. The semiconductor memory device according to claim 1, further comprising an insulating member extending in the second direction and piercing the stacked body,
    at least one of the second semiconductor pillars being disposed, in each of the steps, between the contact and the insulating member.

7. The semiconductor memory device according to claim 1, further comprising an insulating member extending in the second direction and piercing the stacked body,
    at least one of the second semiconductor pillars being disposed, in each of the steps, between the contact and the insulating member, and at least one of the second semiconductor pillars being disposed, in each of the steps, on a side of the contact distal to the first region of the stacked body where the steps are not formed.

8. The semiconductor memory device according to claim 1, wherein a composition of the first semiconductor pillars is the same as a composition of the second semiconductor pillars.

9. The semiconductor memory device according to claim 1, further comprising a second memory film formed between one of the second semiconductor pillars and one of the electrode films,
    a configuration of the first memory film being the same as a configuration of the second memory film.

* * * * *